(12) United States Patent
Sato et al.

(10) Patent No.: US 8,068,213 B2
(45) Date of Patent: Nov. 29, 2011

(54) PHOTOMASK, METHOD OF LITHOGRAPHY, AND METHOD FOR MANUFACTURING THE PHOTOMASK

(75) Inventors: Takashi Sato, Kanagawa (JP); Takashi Sakamoto, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 440 days.

(21) Appl. No.: 12/314,404

(22) Filed: Dec. 10, 2008

(65) Prior Publication Data

US 2009/0098473 A1    Apr. 16, 2009

Related U.S. Application Data

(62) Division of application No. 10/927,320, filed on Aug. 27, 2004, now Pat. No. 7,482,102.

(30) Foreign Application Priority Data

Aug. 27, 2003 (JP) .................. P2003-303479

(51) Int. Cl.
*G03B 27/32* (2006.01)
*G03C 5/00* (2006.01)

(52) U.S. Cl. .................................. 355/77; 430/30

(58) Field of Classification Search .............. 430/30; 355/55, 77

See application file for complete search history.

(56) References Cited

U.S. PATENT DOCUMENTS

| | | | |
|---|---|---|---|
| 5,300,786 | A | 4/1994 | Brunner et al. |
| 6,088,113 | A | 7/2000 | Kim |
| 6,091,486 | A | 7/2000 | Kirk |
| 6,376,139 | B1 | 4/2002 | Fujisawa et al. |
| 6,674,511 | B2 | 1/2004 | Nomura et al. |
| 6,701,512 | B2 | 3/2004 | Sutani et al. |
| 7,094,504 | B2 | 8/2006 | Izuha et al. |
| 2002/0021434 | A1 | 2/2002 | Nomura et al. |
| 2002/0102477 | A1 | 8/2002 | Tanaka et al. |
| 2003/0020901 | A1 | 1/2003 | Kunkel et al. |
| 2003/0123052 | A1 | 7/2003 | Ausschnitt et al. |
| 2007/0134563 | A1 | 6/2007 | Fukuhara et al. |

FOREIGN PATENT DOCUMENTS

| | | |
|---|---|---|
| JP | 3-5753 | 1/1991 |
| JP | 4-181251 | 6/1992 |
| JP | 6-302492 | 10/1994 |
| JP | 8-248620 | 9/1996 |
| JP | 8-286391 | 11/1996 |
| JP | 9-50116 | 2/1997 |

(Continued)

OTHER PUBLICATIONS

Search Report dated Oct. 10, 2007, issued by the Netherlands Patent Office for Netherlands Application No. 135506.

(Continued)

*Primary Examiner* — Hung Henry Nguyen
*Assistant Examiner* — Michelle Iacoletti
(74) *Attorney, Agent, or Firm* — Finnegan, Henderson, Farabow, Garrett & Dunner, L.L.P.

(57) ABSTRACT

A photomask has a monitoring pattern configured to obtain information required for adjusting optical system of a projection lithography tool. The monitoring pattern encompasses a mask substrate and an asymmetrical diffraction grating delineated on the mask substrate, configured to generate a positive first order diffracted light and a negative first order diffracted light in different diffraction efficiencies. The asymmetrical diffraction grating includes a plurality of probing-phase shifters, disposed periodically on the mask substrate in parallel, and a plurality of opaque strips disposed on light-shielding faces of the probing-phase shifters. An asymmetrically recessed ridge implements each of the probing-phase shifters.

4 Claims, 18 Drawing Sheets

FOREIGN PATENT DOCUMENTS

| | | |
|---|---|---|
| JP | 10-69063 | 3/1998 |
| JP | 10-104817 | 4/1998 |
| JP | 11-15128 | 1/1999 |
| JP | 2001-100392 | 4/2001 |
| JP | 2001-102282 | 4/2001 |
| JP | 2001-189264 | 7/2001 |
| JP | 2001-351853 | 12/2001 |
| JP | 2002-55435 | 2/2002 |
| JP | 2002-289503 | 10/2002 |
| JP | 2002-299205 | 10/2002 |
| JP | 2003-114514 | 4/2003 |
| WO | WO 03/042629 A1 | 5/2003 |

OTHER PUBLICATIONS

Notification of Reasons for Refusal issued by the Japanese Patent Office dated Dec. 5, 2006, for Japanese Patent Application No. 2003-303479, and English-language translation thereof.

PHOTOMASK, METHOD OF LITHOGRAPHY, AND METHOD FOR MANUFACTURING THE PHOTOMASK

CROSS REFERENCE TO RELATED APPLICATIONS

This is a division of application Ser. No. 10/927,320, filed Aug. 27, 2004 now U.S. Pat. No. 7,482,102, which is incorporated herein by reference.

This application is based upon and claims the benefit of priority from prior Japanese Patent Application P2003-303479 filed on Aug. 27, 2003; the entire contents of which are incorporated by reference herein.

BACKGROUND OF THE INVENTION

1. Field of the Invention

The present invention relates to a photomask, a lithography method and a method for manufacturing the photomask. In particular, the present invention pertains to an adjustment technology of an optical system of the projection lithography tool, installing a photomask on which a phase shifter is formed.

2. Description of the Related Art

Since photolithography patterns formed on a semiconductor wafer are continually becoming increasingly fine and precise, it becomes more and more important to precisely arrange the wafer in the focal point. Defocus caused by incorrect arrangement of the wafer leads to defective products. Therefore, methods for arranging the wafer in the focal point correctly have been developed. For example, asymmetrical diffracting gratings are employed. The asymmetrical diffracting gratings have asymmetrical diffracting portions, which generate phase different of light reaching value that is larger than 0 degrees and lower than 180 degrees. Such asymmetrical diffracting gratings generate a positive first order diffracting light and a negative first order diffracting light with different diffraction efficiencies.

When asymmetrical diffracting gratings are exposed with laser light, projected images on the wafer of the asymmetrical diffracting gratings displace perpendicularly to the optical axis if the position of the wafer is varied in the direction of the optical axis. The displacement of the projected images and the variation of the position of the wafer have a linear relationship. Therefore, once the linear relationship is obtained, it is possible to calculate wafer position from measured position of projected images. However, earlier methods require preparing two photomasks, one for monitoring of wafer position, and another for exposing a device pattern on a wafer. This is because it is difficult to fabricate both an asymmetrical diffracting grating and a device pattern on single mask substrate. Therefore, preparing two photomasks raises development costs, and the exchanging of photomasks interrupts continuous production. Further, defocus failure may be caused while the photomasks are exchanged

SUMMARY OF THE INVENTION

A feature of the present invention inheres in a photomask having a monitoring pattern configured to obtain information required for adjusting optical system of a projection lithography tool, the monitoring pattern encompassing a mask substrate and an asymmetrical diffraction grating delineated on the mask substrate, configured to generate a positive first order diffracted light and a negative first order diffracted light in different diffraction efficiencies. Here, the asymmetrical diffraction grating includes a plurality of probing-phase shifters formed of semi-transparent material, disposed periodically on the mask substrate in parallel, and a plurality of opaque strips disposed on light-shielding faces of the probing-phase shifters. Here, each of the probing-phase shifters is implemented by an asymmetrically recessed ridge, geometry of the asymmetrically recessed ridge is defined by (a) a strip-shaped entrance face contacting with the mask substrate, extending along the longitudinal direction of the asymmetrically recessed ridge; (b) a strip-shaped exit face opposite to the entrance face implemented by a top surface of a lower step of the asymmetrically recessed ridge, the lower step being displaced to one of long sides of the asymmetrically recessed ridge in a plan view, extending along the longitudinal direction, and (c) a strip-shaped light-shielding face implemented by a top surface of an upper step of the asymmetrically recessed ridge, the upper step has a higher horizontal level than the lower step, the upper step being adjacent to the lower step and displaced to another one of long sides of the asymmetrically recessed ridge in a plan view, extending along the longitudinal direction.

Another feature of the present invention inheres in a method for projecting an image of a photomask on a wafer, including:

(a) installing a photomask having a device pattern and an asymmetrical diffraction grating implemented by probing-phase shifters into a projection lithography tool, the asymmetrical diffraction grating being configured to generate a positive first order diffracted light and a negative first order diffracted light in different diffraction efficiencies;

(b) obtaining image information of projected images of the asymmetrical diffraction gratings on monitoring wafers, by varying the positions of the monitoring wafers along an optical axis of an optical system of the projection lithography tool;

(c) calculating an approximate function prescribing a relationship between the positions of the monitoring wafers along the optical axis and the image information;

(d) calculating the most suitable focal position for a working wafer;

(e) adjusting the position of the working wafer to the most suitable focal position in the optical system; and (f) projecting the device pattern on the working wafer, while keeping the adjusted position of the working wafer.

Still another feature of the present invention inheres in a method for manufacturing a photomask, including:

(a) forming a semi-transparent film on a mask substrate;

(b) forming a plurality of opaque strips on the semi-transparent film;

(c) selectively etching the semi-transparent film until the mask substrate is exposed so as to delineate first phase shifting films in a device-pattern-scheduled area and second phase shifting films in a monitoring-pattern-scheduled area, the second phase shifting films are implemented by a plurality striped patterns of the semi-transparent films, which are repetitively and periodically arranged;

(d) selectively etching the opaque strips until the second phase shifting films are exposed in the monitoring-pattern-scheduled area so that part of the opaque strips remain displaced from a geometrical center, implementing an asymmetrical topology, while the opaque strips in the device-pattern-scheduled area are entirely etched from top surfaces of the first phase shifting films; and (e) etching the first phase shifting films to a specific thickness, which can establish a phase difference between transmitted light and not transmitted light, so as to provide phase shifters serving as a device pattern in the device-patternscheduled area, and simultaneously, selectively etching the exposed portions of the second phase shifting films so as to form one-sidedly displaced recesses in the second phase shifting films, the bottom of the recess establishes the specific thickness of the second phase shifting films, so as to provide probing-phase shifters, thereby providing an asymmetrical diffraction grating, which generates positive first order diffracted light and negative first order diffracted light in different diffraction efficiencies in the monitoring-pattern-scheduled area.

BRIEF DESCRIPTION OF DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE INVENTION

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers.

First Embodiment

Figure 1:
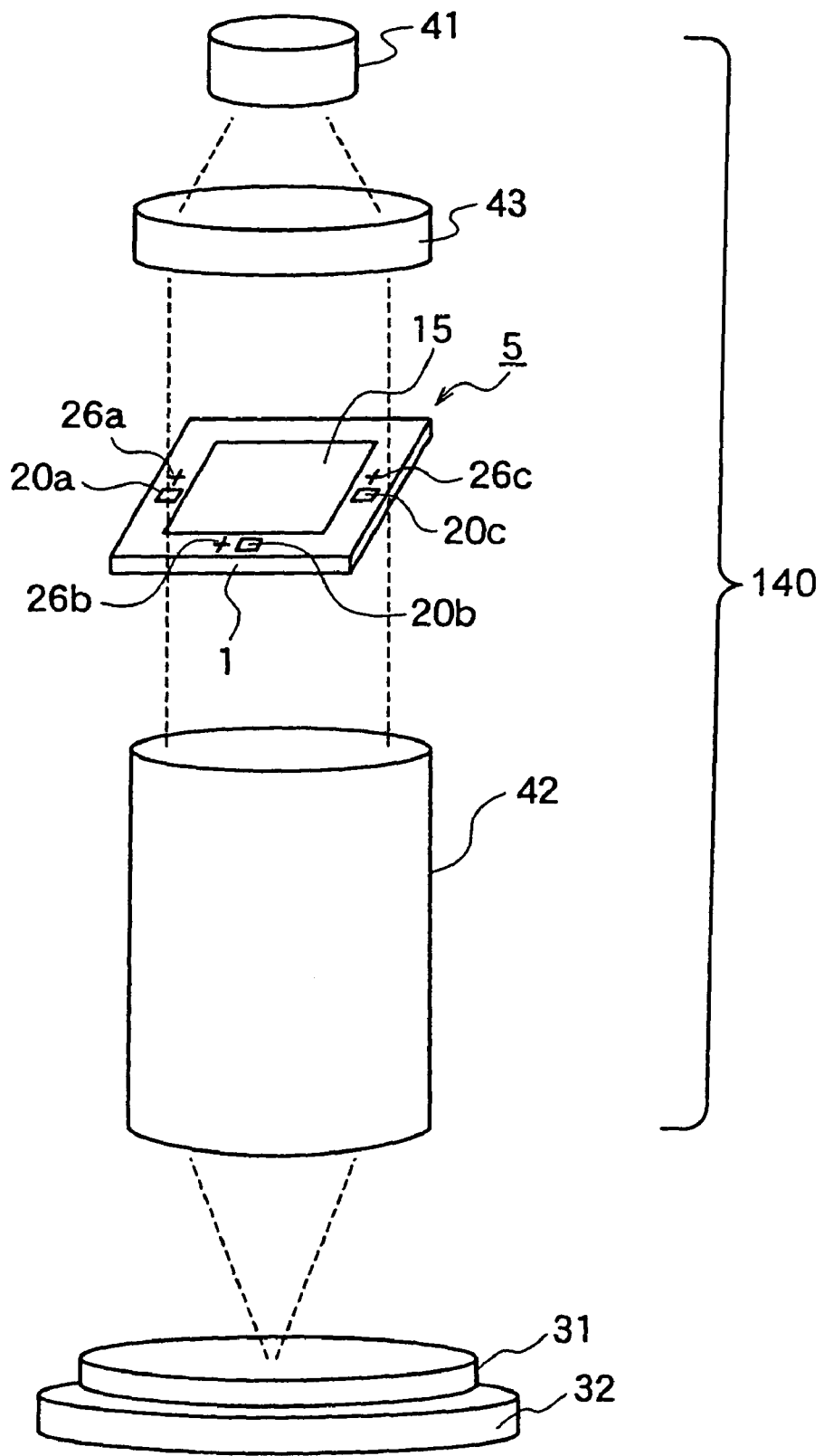
FIG. 1 is an exploded perspective view showing a reduction projection lithography tool in accordance with a first embodiment of the present invention.

A reduction projection lithography tool according to a first embodiment of the present invention includes an optical system 140 and a wafer stage 32 disposed under the optical system 140 as shown in FIG. 1. The optical system 140 encompasses an illumination source 41, a condenser lens 43 disposed under the illumination source 41, and a projection optical system 42 disposed under the condenser lens 43. A photomask 5 is disposed in between the condenser lens 43 and the projection optical system 42 so that the photomask 5 can take in the light beamed from the illumination source 41 and the condenser lens 43 can subsequently focus the light transmitted through the photomask 5. For example, the photomask 5 may be a reticle used in a step and repeat projection lithography tools. The wafer 31 is disposed on the wafer stage 32. The photomask 5 includes a device pattern 15 and a plurality of monitoring patterns 20a, 20b, and 20c. The lights diffracted at the device pattern 15 and at each of the monitoring patterns 20a, 20b, and 20c are condensed by the projection optical system 42 and imaged on the wafer 31 respectively.

Figure 2:
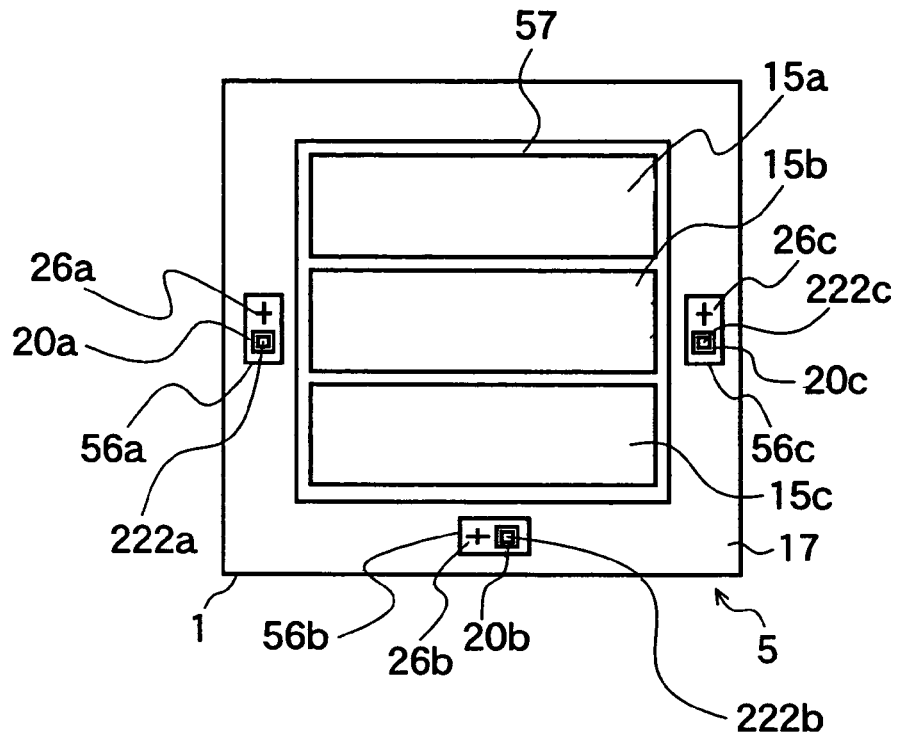
FIG. 2 is a plan view showing a photomask in accordance with the first embodiment of the present invention.

As depicted by the enlarged plan view shown in FIG. 1 and FIG. 2, the photomask 5 includes a mask substrate 1, an opaque film 17, a plurality of monitoring windows 56a, 56b and 56c established on the opaque film 17 and a device window 57 established on the opaque film 17. The mask substrate 1 is transparent and composed of a substance such as fused silica glass. The opaque film 17 is composed of a substance such as chromium (Cr) disposed on the mask substrate 1. Yet each of the monitoring patterns 20a, 20b, and 20c are established on the mask substrate 1 which is exhibited by the monitoring windows 56a, 56b and 56c established the opaque film 17.

Figure 3:
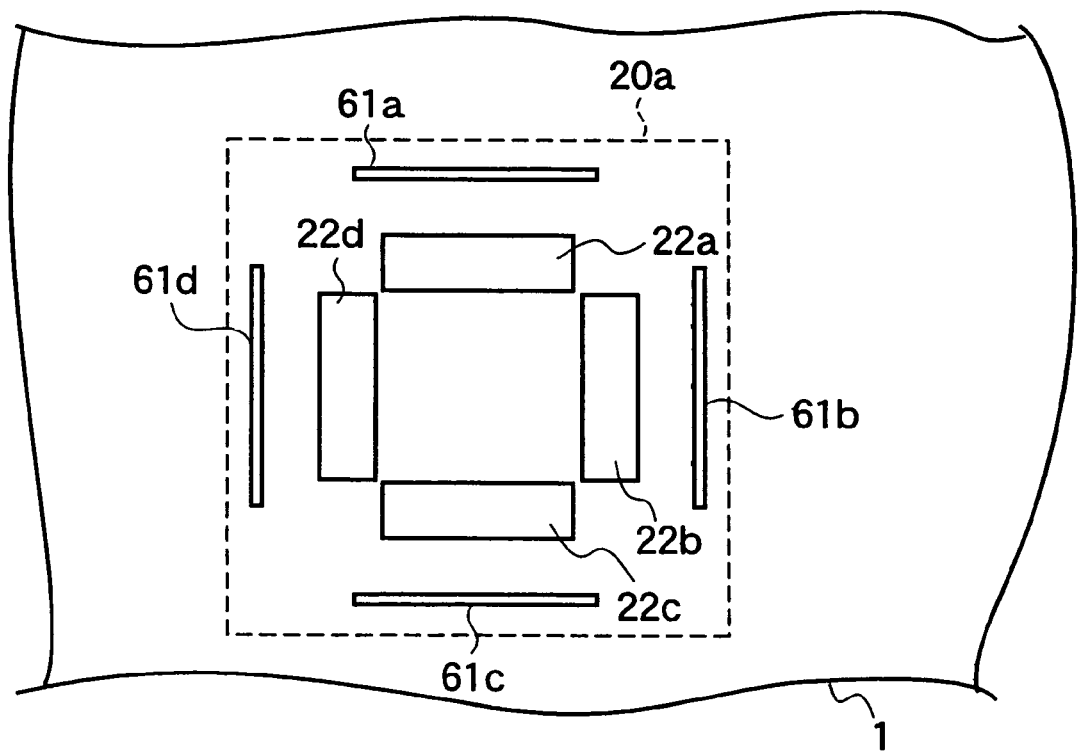
FIG. 3 is a plan view showing a monitoring pattern of the photomask in accordance with the first embodiment of the present invention.

And device patterns 15a, 15b and 15c are established respectively on the mask substrate 1 which is exhibited by the device window 57. Each of the monitoring patterns 20a, 20b, and 20c provide asymmetrical-diffraction-grating sets 222a, 222b and 222c. Further, each of the alignment marks 26a, 26b and 26c are established on the mask substrate 1 exhibited by the monitoring windows 56a, 56b and 56c, being situated adjacent to the asymmetrical-diffraction-grating sets 222a, 222b and 222c. The alignment marks 26a, 26b and 26c are used so as to align the relative positioning of the photomask 5 versus the wafer 31:

FIG. 3 is an example enlarged plan view showing the monitoring pattern 20a shown in FIG. 2. The monitoring pattern 20a includes first, second, third and fourth asymmetrical diffraction gratings 22a, 22c, 22b and 22d configured to generate a positive first order diffracted light and a negative first order diffracted light in different diffraction efficiencies. The asymmetrical-diffraction-grating sets 222a is a generic term representing the set of first, second, third and fourth asymmetrical diffraction gratings 22a, 22c, 22b and 22d shown in FIG. 2. Each of the first, second, third and fourth asymmetrical diffraction gratings 22a, 22c, 22b and 22d are disposed forming four sides of a square on the surface of the mask substrate 1. Further the monitoring pattern 20a encompasses four isolated opaque patterns 61a, 61c, 61b and 61d, which are disposed parallel to the corresponding first, second, third and fourth asymmetrical diffraction gratings 22a, 22c, 22b and 22d so that the isolated opaque patterns 61a, 61b, 61c and 61 can surround the outside of the square, which is implemented by the first, second, third and fourth asymmetrical diffraction gratings 22a, 22c, 22b and 22d. Therefore, the opaque patterns 61a, 61c, 61b and 61d are also disposed so as to form four sides of a square. Each of the isolated opaque patterns 61a, 61c, 61b and 61d is paired with the corresponding first, second, third and fourth asymmetrical diffraction gratings 22a, 22c, 22b and 22d so as to form a reference projected image respectively. Then, each of the relative distances can be defined on the wafer 31 as the distance between one of the projected images on the wafer 31 ascribable to the first, second, third and fourth asymmetrical diffraction gratings 22a, 22c, 22b and 22d and the corresponding reference projected image on the wafer 31, each of the reference projected images are ascribable to the corresponding isolated opaque patterns 61a, 61c, 61b and 61d. As the first, second, third and fourth asymmetrical diffraction gratings 22a, 22c, 22b and 22d are assembled together so as to form a set, which implements the asymmetrical-diffraction-grating set 222a as shown in FIG. 2, another asymmetrical-diffraction-grating sets 222b and 222a are generic terms, each representing the set of four asymmetrical diffraction gratings. The illustration of the details of the asymmetrical-diffraction-grating sets 222b and 222a are omitted, because each of the configurations of the other monitoring patterns 20b and 20c shown in FIG. 2 is similar to the configuration of the monitoring pattern 20a shown in FIG. 3.

Figure 4:
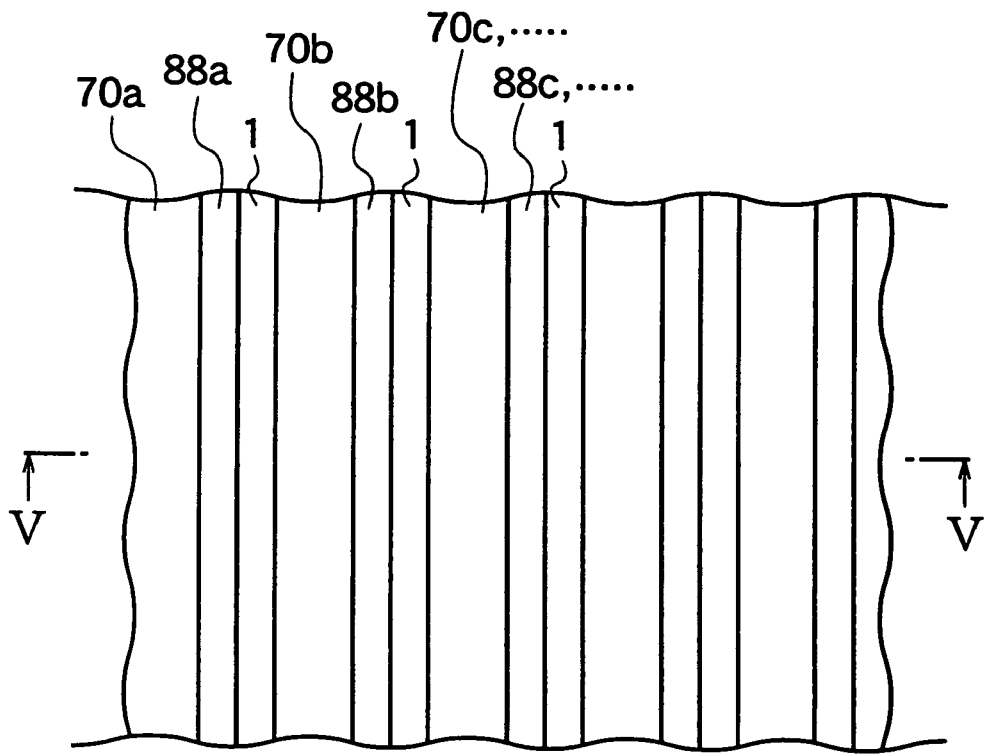
FIG. 4 is a plan view showing an asymmetrical diffracting grating of the monitoring pattern in accordance with the first embodiment of the present invention.
Figure 5:
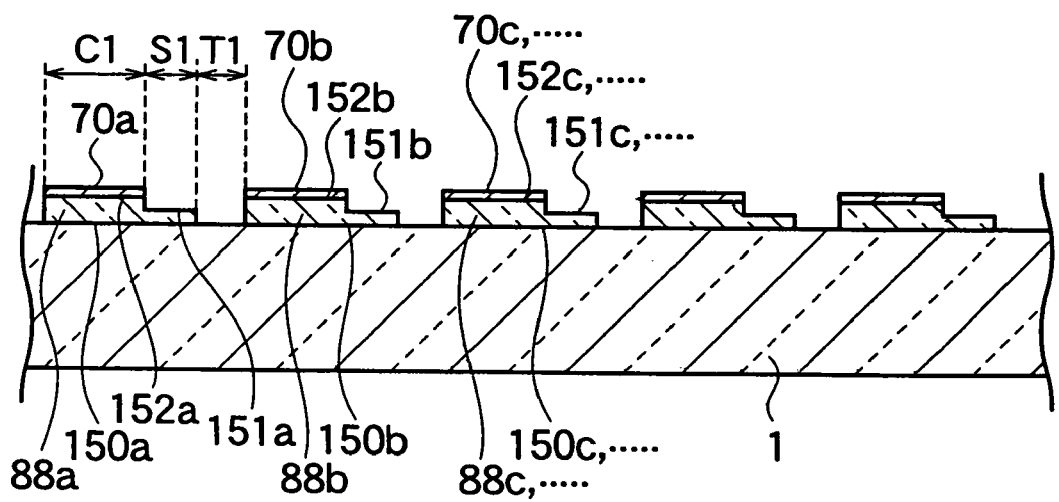
FIG. 5 is a cross-sectional view showing the asymmetrical diffracting grating of the monitoring pattern in accordance with the first embodiment of the present invention.

Yet FIG. 4 is a plan view enlarging a part of the first asymmetrical diffraction grating 22a shown in FIG. 3, and FIG. 5 is a cross sectional view showing the first asymmetrical diffraction grating 22a taken on line V-V in FIG. 4. As shown in FIG. 5, the first asymmetrical diffraction grating 22a is implemented by a plurality of first asymmetrically recessed ridges, each of which has an asymmetric topology, and the first asymmetrically recessed ridges are disposed periodically on the mask substrate 1. And as shown in FIG. 4, each of the first asymmetrically recessed ridges runs in parallel so as to form a striped geometry in a plan view. Each of the first asymmetrically recessed ridge is formed of semi-transparent material.

In FIG. 5, the most left asymmetrically recessed ridge (first asymmetrically recessed ridge) has a first exit face 151a implemented by a top surface of the lower step, or the bottom of the recess, and a first light-shielding face 152a implemented by a top surface of the upper step, which has a higher horizontal level than the lower step so as to form the asymmetrical topology of a concave polygon in a cross sectional view. The lower step is displaced from the geometric center to one of long sides (right long side) of the first asymmetrically recessed ridge as shown in a plan view of FIG. 4. The upper step being adjacent to the lower step is displaced to another one of long sides (left long side) of the first asymmetrically recessed ridge as shown in FIG. 4. Both of the first exit face 151a and the first light-shielding face 152a extend along the longitudinal direction of the first asymmetrically recessed ridge.

Similarly, the second left asymmetrically recessed ridge of the second from the left end has a first exit face 151b implemented by a top surface of the lower step and a first light-shielding face 152b implemented by a top surface of the upper step, which has a higher horizontal level than the lower step so as to form the asymmetrical topology. The third left asymmetrically recessed ridge from the left end has a first exit face 151c implemented by a top surface of the lower step and a first light-shielding face 152c implemented by a top surface of the upper step, which has a higher horizontal level than the lower step so as to form the asymmetrical topology. And the fourth left, fifth left a asymmetrically recessed ridges (first asymmetrically recessed ridges) and so on have the similar the asymmetric configurations, each having the lower and upper steps. The bottom surfaces of the first, second and third asymmetrically recessed ridges (first asymmetrically recessed ridges), . . . from the left end implement first entrance faces 150a, 150b, 150c, . . . contacting with the mask substrate 1. These asymmetrically recessed ridges established by two steps, which are formed of the semi-transparent material implement first probing-phase shifters 88a, 88b, 88c, . . . respectively. And a plurality of first opaque strips 70a, 70b, 70c, . . . are one-sidedly disposed on the first light-shielding faces 152a, 152b, 152c, . . . of the first probing-phase shifters 88a, 88b, 88c, . . . respectively.

It is possible to prescribe the geometrical dimensions of each lattice of the first asymmetrical diffraction grating 22a with a relationship:

$$C1:S1:T1=2:1:1 \tag{1}$$

where C1 is a width of each of the first opaque strips 70a, 70b, 70c, . . . S1 is a width of each of the exit faces 151a, 151b, 151c, . . . and T1 is the interval between each of the first probing-phase shifters 88a, 88b, 88c, . . . which are disposed on the mask substrate 1. In this case, for instance, with the reduction projection lithography tool shown in FIG. 1, when irradiating a light emitted from the light source 41, or the light emitted from an argon fluoride (ArF) excimer laser having a wavelength of 193 nm, onto the photomask 5, if C1 is taken to be 0.2 μm, S1 and T1 is given to 0.1 μm.

In addition, the height of the exit faces 151a, 151b, 151c, . . . is established so that the light leaving from the exit faces 151a, 151b, 151c, . . . , or the light transmitted through the part defined by the width S1, can have a phase difference of integer multiples of 90 degrees against the light transmitted through the part defined by the width T1. In other words, the height of the exit faces 151a, 151b, 151c, . . . is established so that the light which transmits through the first probing-phase shifters 88a, 88b, 88c, . . . respectively at the exit faces 151a, 151b, 151c, . . . can have a phase difference of integer multiples of 90 degrees against the light which doesn't transmit through the first probing-phase shifters 88a, 88b, 88c, . . . . For instance, in the case where each of the first probing-phase shifters 88a, 88b, 88c, . . . is formed of such a material as molybdenumsilicide (MoSi), in order for the transmitted light to generate a 90-degree-phase difference, each height of the exit faces 151a, 151b, 151c, . . . from the first entrance faces 150a, 150b, 150c, . . . may be about 90.8 nm and in that case, the transmittance is 24.5%. Except for MoSi, such materials as oxi-nitride of molybdenumsilicide (MoSiON), zirconium silicate (ZrSiO), amorphous carbon, silicon nitride (SiN), titanium nitride (TiSiN), etc. can be also acceptable for use as semi-transparent materials making of the first probing-phase shifters 88a, 88b, 88c, . . . .

Since each configuration of the second, third and fourth asymmetrical diffraction gratings 22c, 22b and 22d shown in FIG. 3 is similar to one of the first asymmetrical diffraction grating 22a, overlapping or redundant description will be omitted.

Figure 6:
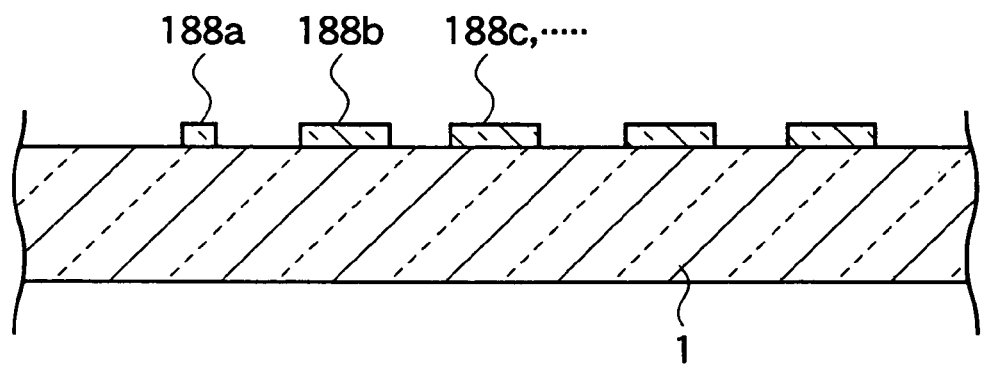
FIG. 6 is a cross-sectional view showing a device pattern of the photomask in accordance with the first embodiment of the present invention.

On the other hand, FIG. 6 is an example enlarged cross-sectional view showing part of the device pattern 15a. As shown in FIG. 6, the device pattern 15a includes respectively a plurality of phase shifting films 188a, 188b, 188c, . . . , which are formed of semi-transparent material disposed periodically on the surface of the mask substrate 1.

Herein, the thickness of the phase shifting films 188a, 188b, 188c, . . . is established so that the light which transmits through each of the phase shifting films 188a, 188b, 188c, . . . can have integer multiples of a 180-degree-phase difference against the light which doesn't transmit through the phase shifting films 188a, 188b, 188c, . . . . For instance, in the case where each of the phase shifting films 188a, 188b, 188c, . . . is formed of such a material as molybdenumsilicide (MoSi), when irradiating with an argon fluoride (ArF) excimer laser light from the light source 41, in order for the transmitted light to generate a 180-degree-phase difference, each thickness of the phase shifting films 188a, 188b, 188c, . . . may be about 181.5 nm and in that case, the transmittance is 6%. Since each configuration of the other device patterns 15b and 15c shown in FIG. 2 is similar to the one shown in FIG. 6, the diagram will be omitted.

Figure 7:
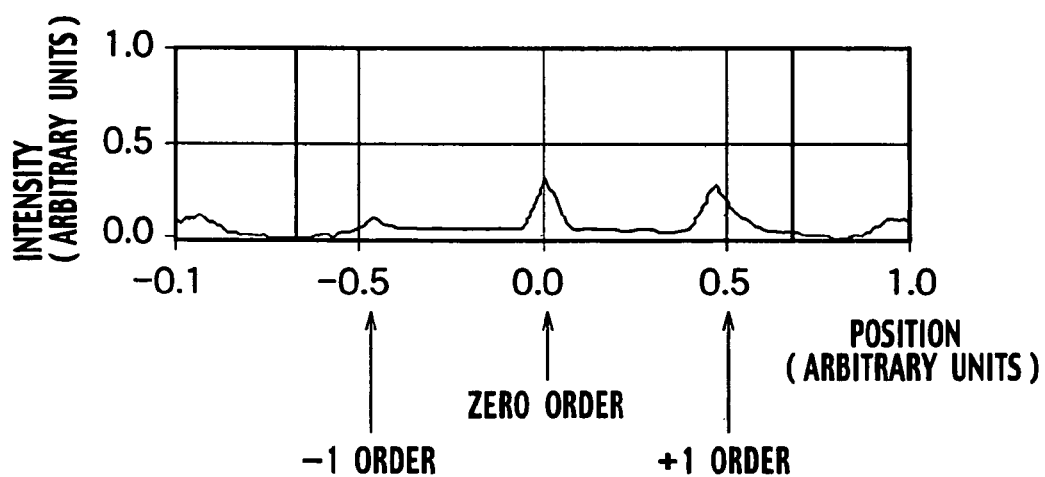
FIG. 7 is a diagram showing a distribution of light intensity on a surface of pupil in accordance with the first embodiment of the present invent.

Next, FIG. 7 shows the result of calculation of the distribution of light intensity on the surface of the pupil in the case where an argon fluoride (ArF) excimer laser light is exposed from the upper part of the mask substrate 1, with the surface having the first asymmetrical diffraction grating 22a facing downward. In FIG. 7, abscissa represents the position within the surface of the pupil, while ordinate represents the light intensity. As shown in FIG. 7, the intensity of a positive first order diffracted light is generated strongly, while the intensity of a negative first order diffracted light is generated weakly, in relation to the intensity of the zero order diffracted light on the pupil location, so as t6 implement an asymmetrical diffraction.

Yet, when the thickness defined by the distance between the first entrance faces 150a, 150b, 150c, . . . and the exit faces 151a, 151b, 151c, . . . is established so as to generate a transmitted light having the phase difference of integer multiples of a specific value, which is larger than 0 degree and lower than 180 degrees, against the light which transmitted through the mask substrate 1, a positive first order diffracted light and a negative first order diffracted light which have different diffraction efficiencies can be generated and the diffraction having an asymmetrical topology can be realized.

In other words, with a phase difference of 90 degrees, it is possible to make the diffraction efficiency of the positive first order diffracted light larger than the first negative order diffracted light, and vice versa, so as to implement the asymmetric diffraction.

Then, with a photomask 5, on which first, second, third and fourth asymmetrical diffraction gratings 22a, 22c, 22b and 22d are disposed symmetrically so as to form four sides of a square, respectively, such that the first and second asymmetrical diffraction gratings 22a and 22c implement a mirror image, and the third and fourth asymmetrical diffraction gratings 22b and 22d implement another mirror image. The second asymmetrical diffraction grating 22c is on the opposite side of the first asymmetrical diffraction gratings 22a. The fourth asymmetrical diffraction grating 22d is on the opposite side of the third asymmetrical diffraction gratings 22b. The third and fourth asymmetrical diffraction gratings 22b and 22d are aligned on a single central line, which is orthogonal to the central line of the first and second asymmetrical diffraction gratings 22a and 22c. The first and second asymmetrical diffraction gratings 22a and 22c mutually face so that each of the periodic topologies proceeds in mutually reverse directions. The third and fourth asymmetrical diffraction gratings 22b and 22d mutually face so that each of the periodic topologies proceeds in mutually reverse directions. The first and second asymmetrical diffraction gratings 22a and 22c diffract mutually in reverse directions, and the third and fourth asymmetrical diffraction gratings 22b and 22d diffract mutually in reverse directions. And when such a photomask 5, on which the first, second, third and fourth asymmetrical diffraction gratings 22a, 22c, 22b and 22d are provided so as to implement the diffraction along mutually reverse directions, is installed in the reduction projection lithography tool as shown in FIG. 1, and when a plurality of wafers 31, each of which encompasses a target substrate such as a semiconductor substrate and a resist film coated on the target substrate, are exposed respectively by changing the exposure conditions, the relative displacement between the grating pattern (projected image) ascribable to the first asymmetrical diffraction grating 22a and the corresponding reference projected image ascribable to, the isolated opaque patterns 61a changes. Similarly the relative displacement between the grating pattern (projected image) ascribable to the second asymmetrical diffraction grating 22c and the corresponding reference projected image ascribable to the isolated opaque patterns 61c changes. Yet, the relative displacement between the grating pattern (projected image) ascribable to the third asymmetrical diffraction grating 22b and the corresponding reference projected image ascribable to the isolated opaque patterns 61b changes. Further, the relative displacement between the grating pattern (projected image) ascribable to the fourth asymmetrical diffraction grating 22d and the corresponding reference projected image ascribable to the isolated opaque patterns 61d changes. Here, "the exposure condition" means the relative position of the wafer 31 against the photomask 5 measured along the optical axis, the relative position is changed by varying the position of the wafer 31 along the optical axis.

Actually, after the exposure, each of the wafers 31 is wet etched with a developer and a resist pattern can be obtained. In this resist pattern, the change of the relative displacement between the grating pattern (projected image) ascribable to the first asymmetrical diffraction grating 22a and the corresponding reference projected image ascribable to the corresponding isolated opaque patterns 61a can be measured in each of the exposure conditions. For the purpose of measuring the change of the relative distance, a scanning electron microscope (SEM) and an atomic force microscope (AFM), etc. can be acceptable for use. Similarly, in the resist pattern, the change of the relative displacement between the grating pattern (projected image) ascribable to the second asymmetrical diffraction grating 22c and the corresponding reference projected image ascribable to the corresponding isolated opaque patterns 61c can be measured in each of the exposure conditions. Yet, in the resist pattern, the change of the relative displacement between the grating pattern (projected image) ascribable to the third asymmetrical diffraction grating 22b and the corresponding reference projected image ascribable to the corresponding isolated opaque patterns 61b can be measured in each of the exposure conditions. Further, the change of the relative displacement between the grating pattern (projected image) ascribable to the fourth asymmetrical diffraction grating 22d and the corresponding reference projected image ascribable to the corresponding isolated opaque patterns 61d can be measured in each of the exposure conditions.

Figure 8:
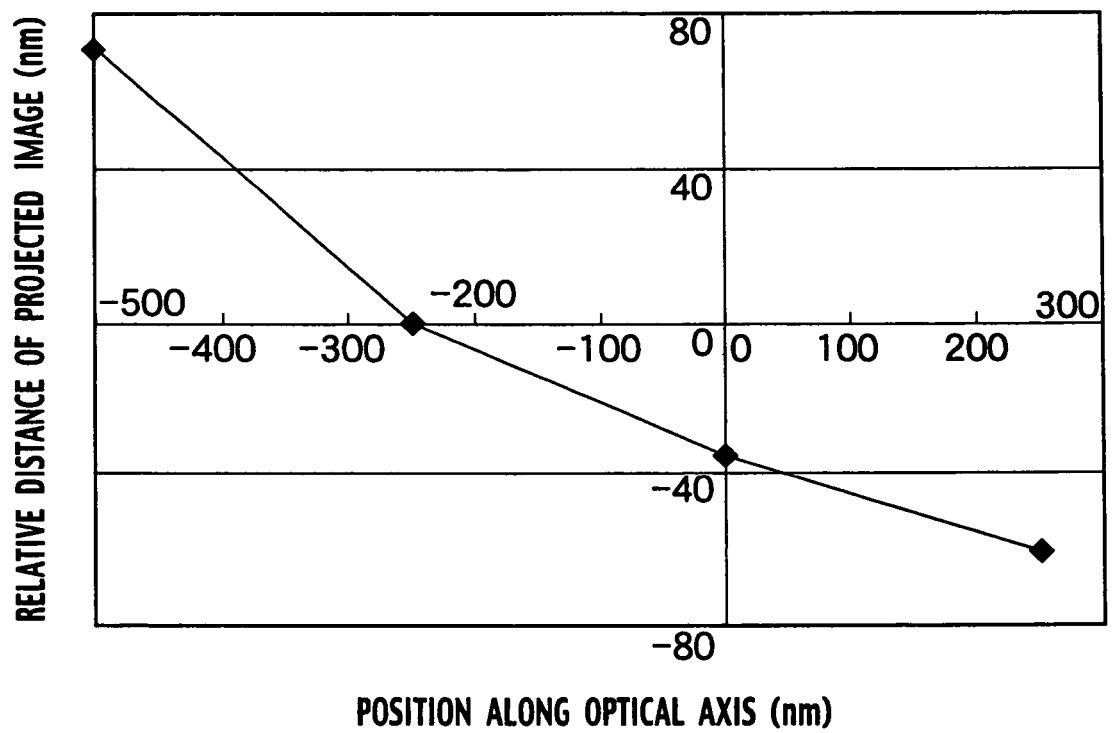
FIG. 8 is a diagram showing a relationship between optical axis intersecting points and relative distances of the projected images in accordance with the first embodiment of the present invention.

FIG. 8 is plotted so that the abscissa can represent the variation of the position along the optical axis and the ordinate can represent the shift of the relative displacement between the position of the grating pattern and the position of the corresponding reference projected image. As understood from FIG. 8, a relationship can be seen such that when the wafer 31 is moved along the optical axis direction, "the relative displacement" between the grating pattern and the corresponding reference projected image also changes. And the similar relationship for "the relative displacement" of the grating pattern against the position of the corresponding reference projected image for the distance between the projected pattern of the second asymmetrical diffraction grating 22c and the isolated opaque pattern 61c is also observed. Yet, the similar relationship for "the relative displacement" of the grating pattern against the position of the corresponding reference projected image for the distance between the projected pattern of the third asymmetrical diffraction grating 22b and the isolated opaque pattern 61b is also observed. Further, the similar relationship for "the relative displacement" of the grating pattern against the position of the corresponding reference projected image for the distance between the projected pattern of the fourth asymmetrical diffraction grating 22d and the isolated opaque pattern 61d is also observed.

Therefore, an approximate function can be obtained by least squares method etc., using the variation of the positions along the optical direction of the wafer 31 in the optical system of the reduction projection lithography tool (the position along the optical axis) and "the relative displacements of the grating pattern against the corresponding reference projected image" on the surface of the wafer 31, as variables. And once the approximate function is memorized, from the next time, it is possible to calculate the working position along the optical axis on a working wafer 31, by substituting the actual measured values of "the relative displacement of the grating pattern against the reference projected image" into the memorized approximate function.

Next, a computer system connected to the projection lithography tool for adjusting an optical system of the projection lithography tool according to the first embodiment of the present invention will be explained with reference to FIG. 1. The computer system includes a central processing unit (CPU) 300, an optical information storage unit 335, an input unit 312, an output unit 313, a program memory 330 and a data memory 331. For the purpose of adjusting the optical system 140, the relative distances between the grating patterns, each of which is a projected image of the asymmetrical diffraction gratings 22a to 22d of the monitoring patterns shown in FIG. 3 respectively, and the corresponding reference projected images, each of which is a projected image of the corresponding isolated opaque patterns 61a to 61d are obtained so as to calculate the positions along the optical axis direction. Therefore, the CPU 300 has a function calculator 301, and an adjustment information calculator 315. And, the reduction projection lithography tool shown in FIG. 1 and the testing tool 322 are connected to the CPU 300. The testing tool 322 may be a scanning electron microscope (SEM) or an atomic force microscope (AFM), etc. Here, the function calculator 301 obtains the image information on the surface of the wafer 31 shown in FIG. 1 and the information of the position of the wafer 31 along the optical axis, from the input unit 312 or the testing tool 322. The image information on the surface of the wafer 31 is implemented by the projected images of the first asymmetrical diffraction grating 22a and the isolated opaque pattern 61a, which are shown in FIG. 3. And the function calculator 301 extracts information showing the relationship between the variation of the positions of the wafer 31 along the optical axis and the relative displacement between the grating pattern, which is the projected image of the asymmetrical diffracting grating 22a, and the corresponding reference projected image, which is the projected image of the corresponding isolated opaque pattern 61a, so as to calculate the approximate function. Also the function calculator 301 calculates the approximate function from the projected images of the second, third and fourth asymmetrical diffracting gratings 22c, 22b and 22d and the corresponding isolated opaque patterns 61c, 61b and 61d as well.

Figure 9:
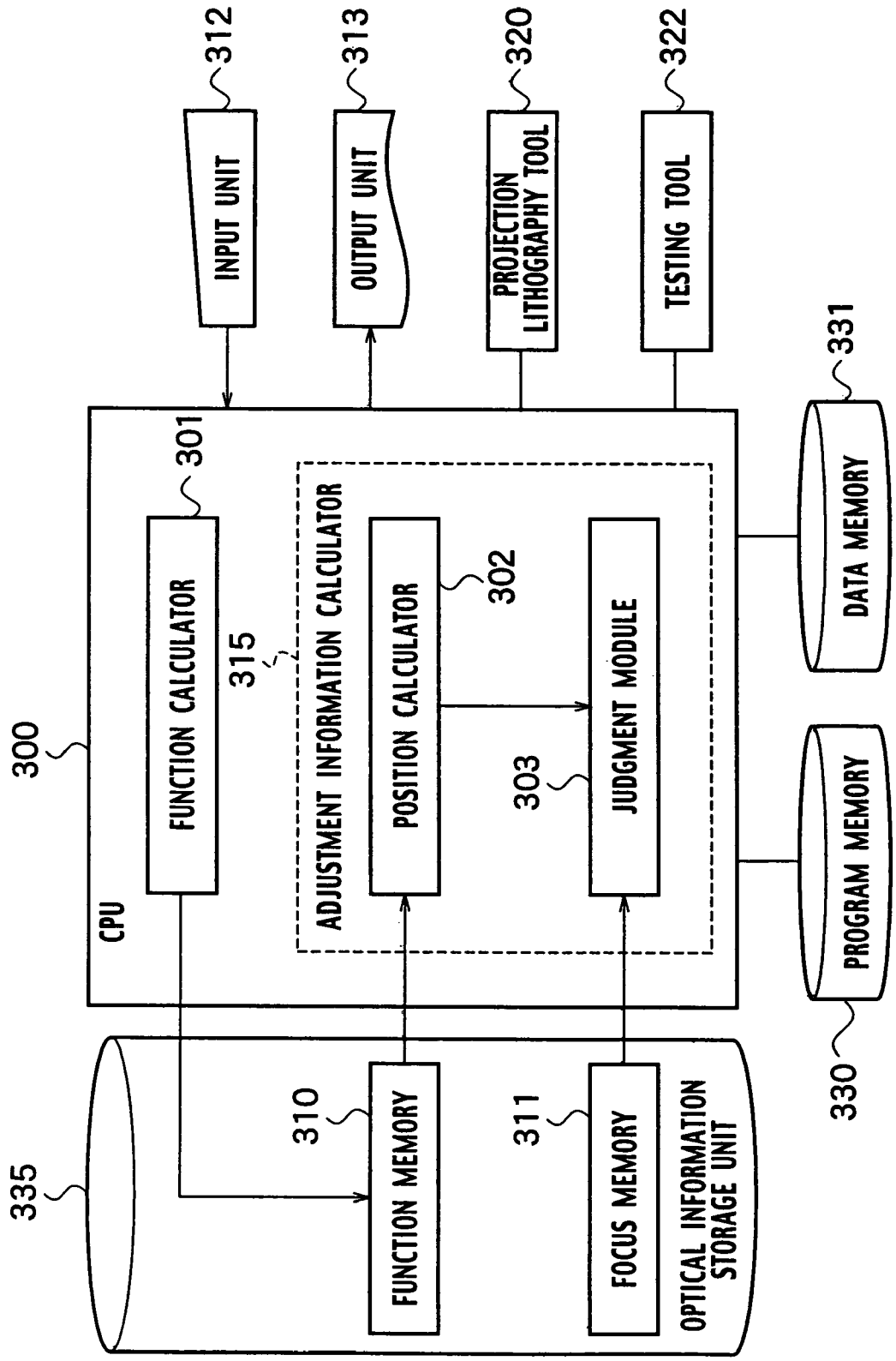
FIG. 9 is a block diagram showing a computer system connected to the projection lithography tool, which can adjust an optical system of the projection lithography tool in accordance with the first embodiment of the present invention.

The optical information memory 335 includes a function memory 310 and a focus memory 310. The function memory 310 stores approximate functions calculated by the function calculator 301. The focus memory 310 stores focal positions and focal depth, etc. of the optical system 140 shown in FIG. 1. The theoretical values derived from the design parameters of the optical system 140 can be stored as the focal position and the focal depth. The range of allowable positions of the wafers 31 along the optical axis, which are determined by the geometries of resist patterns on the wafers 31, can also be stored as the focal positions and the focal depths. Such range of allowable positions of the wafers 31 is determined by the geometries of resist patterns, which are previously delineated on the wafer 31, with a plurality of positions along the optical axis, by transferring the device pattern 15 of the photomask to the resist films, which are coated on the wafers 31. The adjustment information calculator 315 shown in FIG. 9 includes a position calculator 302 and a judgment module 303. The position calculator 302 calculates the position of the wafer 31, by substituting actually measured relative displacements between each of the projected images of the asymmetrical diffraction gratings 22a to 22d and each of the projected images of the isolated opaque patterns 61a to 61d, the asymmetrical diffraction gratings 22a to 22d and the isolated opaque patterns 61a to 61d are shown in FIG. 3, on the surface of the wafer 31 shown in FIG. 1, the measured relative displacements are received from the input unit 321 or the testing tool 322, into the approximate function stored in the function memory 310. The judgment module 303 shown in FIG. 9 compares the calculated position of the wafer 31 calculated by the position calculator 302 with the focal position stored in the focus memory 311, and judges whether the defocus is within an allowable range.

Further, keyboards, mouse pointers and the like can be used as the input unit 312, and liquid crystal display (LCD), light emitting diode (LED) and the like can be used as the output unit 313. The program memory 330 stores programs that the CPU 300 needs to control the transferring of data from the connected devices and calculate approximate function and the defocus. The data memory 331 temporarily stores the data intermediately generated in the computation process of the CPU 300.

Next, an exposure method using a computer system connected to the projection lithography tool for adjusting the optical system of the projection lithography tool will be explained, employing the photomask shown in FIG. 2, referring to FIGS. 1, 3, 9 and 10.

Figure 10:
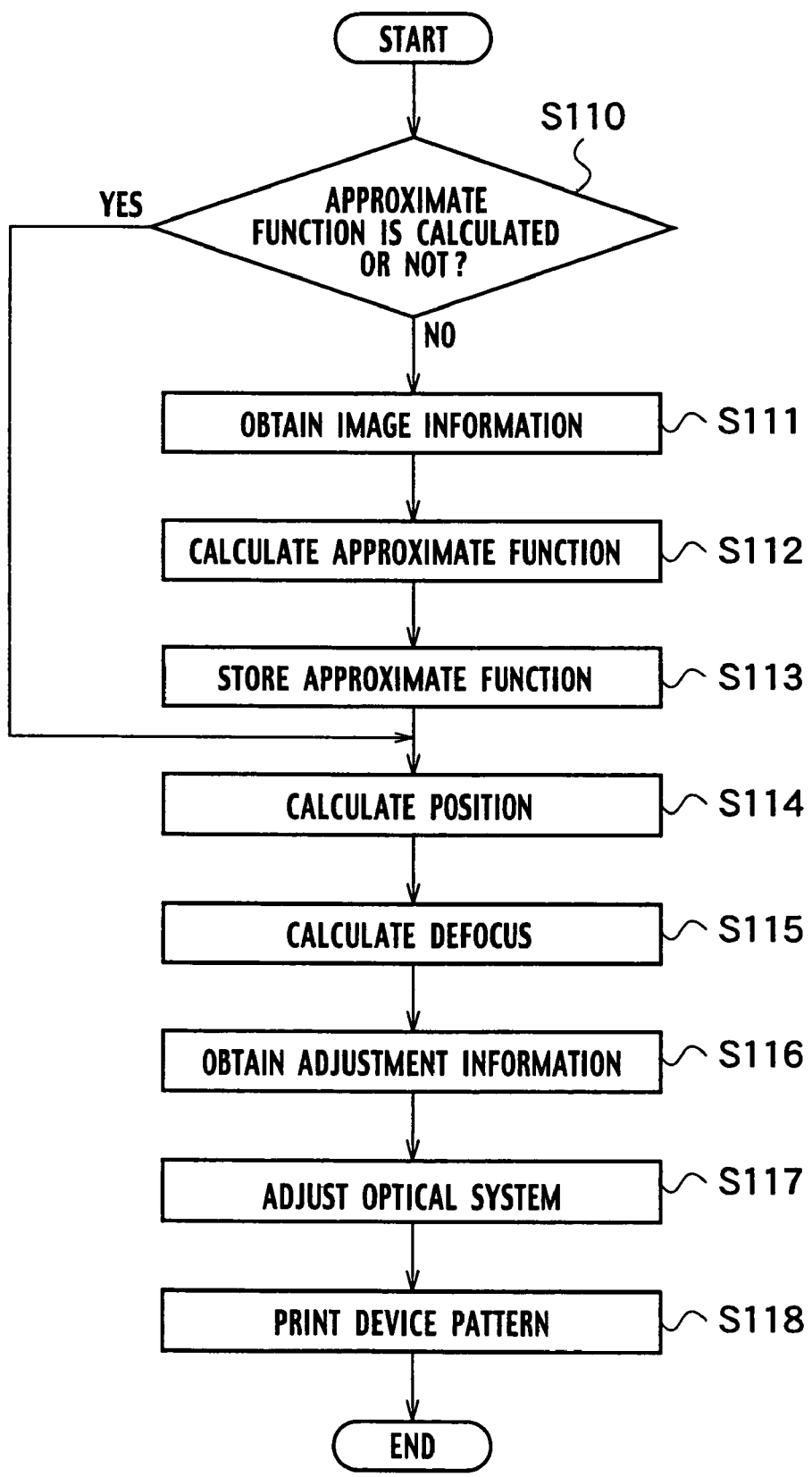
FIG. 10 is a flowchart showing a lithography method in accordance with the first embodiment of the present invention.

(a) At step S110 of FIG. 10, with respect to the photomask installed in the reduction projection lithography tool, whether approximate functions have already been calculated, and have been stored beforehand in the function memory 310 is confirmed. When approximate functions are judged to be stored, the test proceeds to a step S111 of FIG. 10, and when judged not to be stored, the flow chart proceeds to a step S114.

(b) At step S111, with the reduction projection lithography tool shown in FIG. 1, each of the monitoring pattern 20a to 20c of the photomask is projected on the surface of the monitoring wafer 31. The exposures are executed in a plurality of different positions along the optical axis, for a plurality of monitoring wafers 31 prepared, by varying the positions of the monitoring wafers 31 step by step. After the monitoring wafers 31 are exposed and developed, image information of each of the projected images of the asymmetrical diffraction gratings 22a to 22d and each of the isolated opaque patterns 61a to 61d are obtained by the testing tool 322 shown in FIG. 9. And the image information is supplied to the function calculator 301 with the information of the positions along the optical axis.

(c) At step S112, the function calculator 301 through obtaining a plurality of image information, extracts the relationship between the variation of the position of the monitoring wafer 31 along the optical axis shown in FIG. 1 and the relative displacement between the grating pattern of the first asymmetrical diffraction grating 22a and the corresponding reference projected image of the isolated opaque pattern 61a and calculates an approximate function. Also the function calculator 301 calculates the approximate function from the projected images of the second, third and fourth asymmetrical diffracting gratings 22c, 22b and 22d and the corresponding isolated opaque patterns 61c, 61b and 61d as well.

(d) At step S113, the approximate functions calculated by the function calculator 301 are stored in the function memory 310.

(e) At step S114, the approximate functions stored in the function memory 310 and the relative displacement between each of the actually measured positions of the projected images from the asymmetrical diffraction gratings 22a to 22d and each of the actually measured positions of the reference projected images from the isolated opaque patterns 61a to 61d on the surface of the monitoring wafer 31, which are fed from the input unit 321 or the testing tool 322, are stored in the position calculator 302 shown in FIG. 9. The position calculator 302 calculates the most suitable focal position of a working wafer 31, by substituting the actually measured relative displacement into the variable of the relative displacement between the grating pattern and the reference projected images. The most suitable focal position of the working wafer 31 is transmitted to the judgment module 303.

(f) At step S115 of FIG. 10, the focal positions and focal depth, etc. of the optical system 140 shown in FIG. 1, which are stored in the focus memory 310 are read out to the judgment module 303 shown in FIG. 9. The judgment module 303 calculates the defocus from the difference between the present focal position and the calculated most suitable focal position of the working wafer 31 which were calculated at step S114.

(g) At step S116, the defocus calculated at step S115 is delivered to the output unit 313 shown in FIG. 9 and simultaneously, transmitted to the reduction projection lithography tool as well.

(h) At step S117, the reduction projection lithography tool drives the wafer stage 32 shown in FIG. 1 in such a direction canceling the defocus calculated at step S115 and as to adjust the present position of the surface of the working wafer 31 to the most suitable focal position of the optical system 140.

(i) At step S118, the device pattern 15 of the image of the photomask is printed on the working wafer 31 of FIG. 1. Thus completes the procedures in the flow chart shown in FIG. 10.

As mentioned above, through using the photomask 5 shown in FIG. 2, the computer system connected to the projection lithography tool for adjusting an optical system of the projection lithography tool shown in FIG. 9 and the exposure method shown in FIG. 10, it is possible to properly adjust the position of the surface of the working wafer 31 in the focal point of the optical system 140 of the reduction projection lithography tool shown in FIG. 1 and delineate the device pattern 15 on the working wafer 31. In earlier technology, two photomasks are required: one is a testing photomask for the monitoring pattern and the other is a manufacturing photomask for manufacturing semiconductor devices with the device pattern. Since these two photomasks are separate, after adjusting the optical system 140 with the testing photomask, the testing photomask needs to be exchanged to the manufacturing photomask to delineate a device pattern on a working wafer. As the photomask 5 provides both of the monitoring patterns 20a to 20c and the device patterns 15a to 15c respectively, it is possible to begin the process of exposure so as to delineate the device patterns on the working wafer 31, without exchanging the testing photomask, even after the adjustment of focus in the optical system 140 is completed. Therefore, in a semiconductor circuit manufacturing process, an exposure process by a half-tone phase shifter of high precision can be realized. Not having to preparing two photomasks, or testing and manufacturing photomasks, achieves the reduction of time needed for adjusting the optical system 140 and lowers the manufacturing costs.

Figure 11:
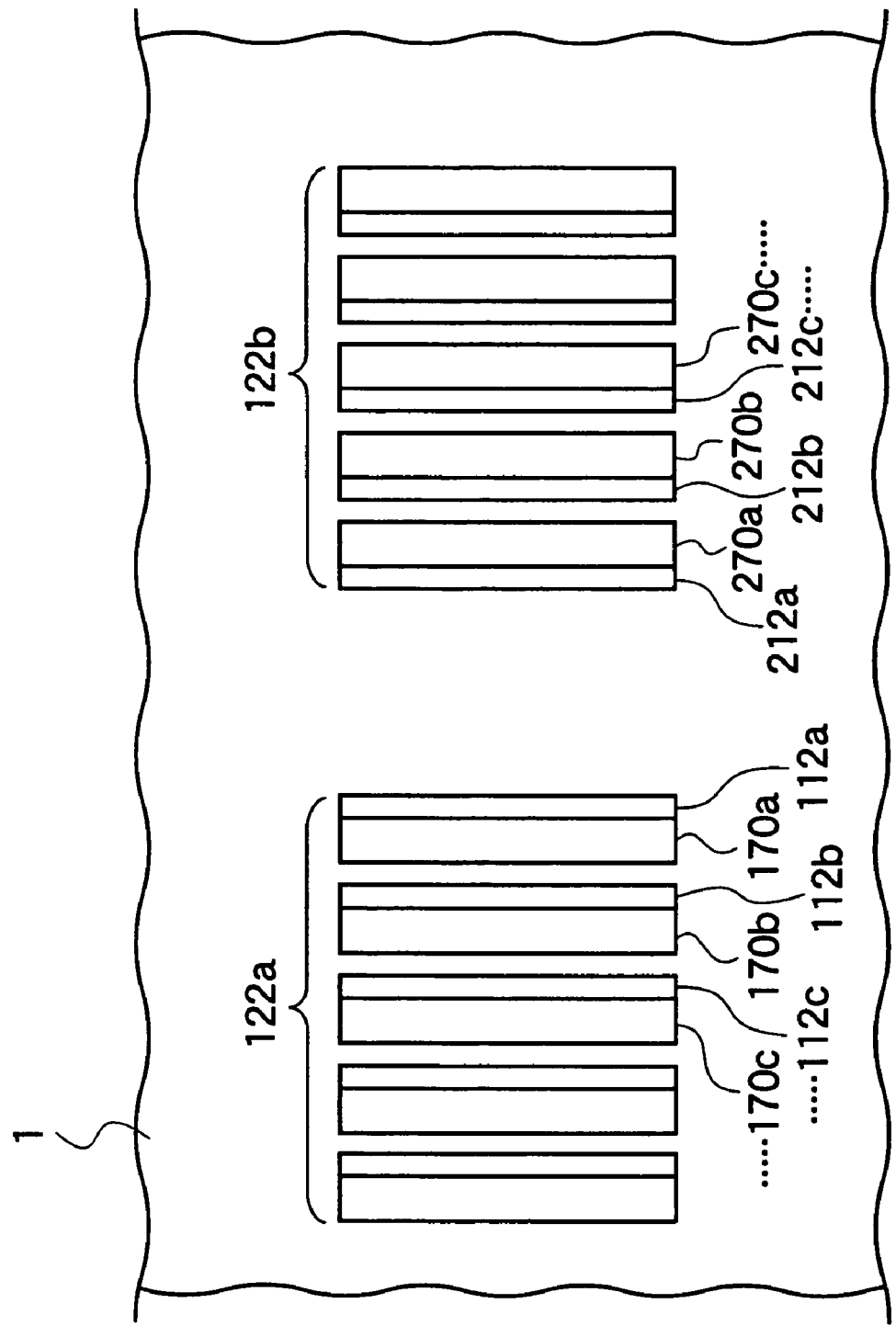
FIG. 11 to FIG. 13 are plan views showing various monitoring patterns in accordance with modifications of the first embodiment of the present invention.

Yet each of the monitoring patterns 20a to 20c of the photomask shown in FIG. 2 is not limited to the configuration shown in FIG. 3. For instance, as shown in FIG. 11, a first asymmetrical diffraction grating 122a and a second asymmetrical diffraction grating 122b can be disposed so that the repetitive periodic patterns of the first asymmetrical diffraction grating 122a and the second asymmetrical diffraction grating 122b can proceed in mutually opposite direction, facing each other. The first asymmetrical diffraction grating 122a and the second asymmetrical diffraction grating 122b are aligned on a single central line, mutually facing so that each of the periodic topologies proceeds in mutually reverse directions, although the single central line is not illustrated, because the existence of the single central line is inherent in FIG. 11.

In FIG. 11, the first asymmetrical diffraction grating 122a represented on the left side has a repetitive periodic structure encompassing the first probing-phase shifters 112a, 112b, 112c, . . . and the first opaque strips 170a, 170b, 170c, . . . which are locally located on the left side of the top surface of the first probing-phase shifters 112a, 112b, 112c, . . . , because a recess (a first recess) displaced rightward from the geometric center is provided on each of the first probing-phase shifters 112a, 112b, 112c, . . . . In FIG. 11, the second asymmetrical diffraction grating 122b represented on the right side has a repetitive periodic structure encompassing second probing-phase shifters 212a, 212b, 212c, . . . and second opaque strips 270a, 270b, 270c, . . . which are locally located on the right side of the top surface of the second probing-phase shifters 212a, 212b, 212c, . . . , because a recess (a second recess) displaced leftward from the geometric center is provided on each of the second probing-phase shifters 212a, 212b, 212c, . . . . The topology of the second asymmetrical diffraction grating 122b is a reverse of the topology of the first asymmetrical diffraction grating 122a.

Figure 12:
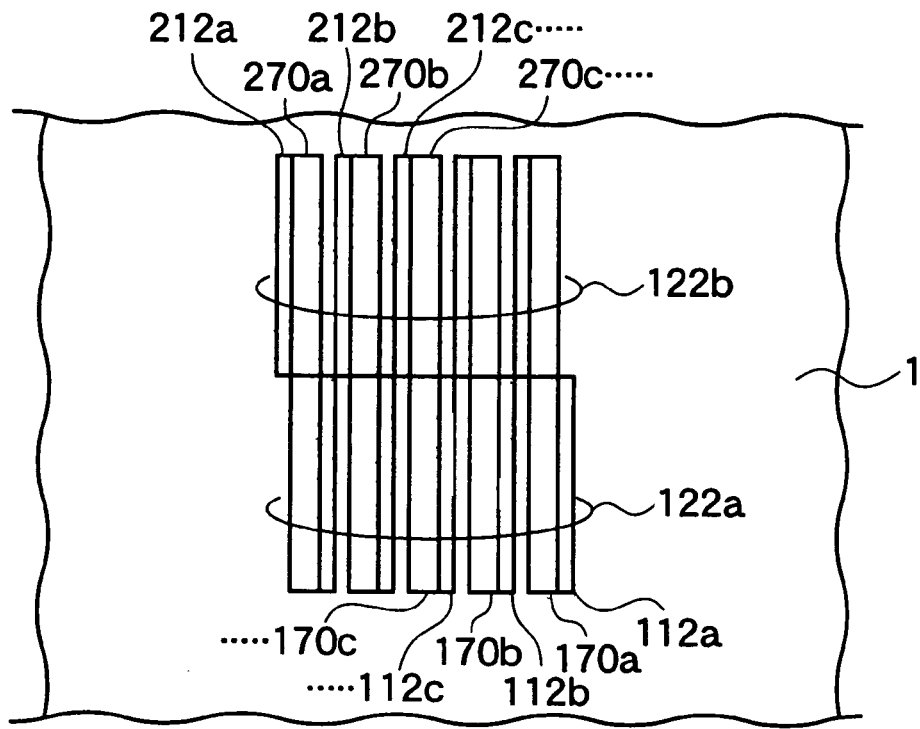

Further, a repetitive periodic pattern of the first asymmetrical diffraction grating 122a and a repetitive periodic pattern of the second asymmetrical diffraction grating 122b, in which the repetitive periodic structures proceed in a mutually reverse direction, can be disposed in parallel, adjoining mutually, as shown in FIG. 12. The first asymmetrical diffraction grating 122a and the second asymmetrical diffraction grating 122b are aligned on separate parallel central lines, although the separate parallel central lines are not illustrated, because the existence of the separate parallel central lines are inherent in FIG. 12. The lower first asymmetrical diffraction grating 122a shown in FIG. 12 encompasses the first probing-phase shifters 112a, 112b, 112c, . . . and the first opaque strips 170a, 170b, 170c, . . . which are locally located on the left side of the top surface of the first probing-phase shifters 112a, 112b, 112c, . . . . The upper second asymmetrical diffraction grating 122b shown in FIG. 12 encompasses the second probing-phase shifters 212a, 212b, 212c, . . . and the second opaque strips 270a, 270b, 270c, . . . which are locally located on the right side of the top surface of the second probing-phase shifters 212a, 212b, 212c, . . . .

When the photomask including a pair of first asymmetrical diffraction grating 122a and second asymmetrical diffraction grating 122b, in which the repetitive periodic structures proceed in a mutually reverse direction, is exposed to the light in the reduction projection lithography tool, while the monitoring wafer 31 travels along an optical axis direction, the position of each of the projected image of the first asymmetrical diffraction grating 122a and the second asymmetrical diffraction grating 122b moves in a mutually opposite direction on the monitoring wafer 31. Therefore, it is possible to observe the linear relationship between the displacement of the projected images and the position along the optical axis on the monitoring wafer 31, achieving two times grater sensitivity than the case in which the relative distance is measured against the reference projected image.

Figure 13:
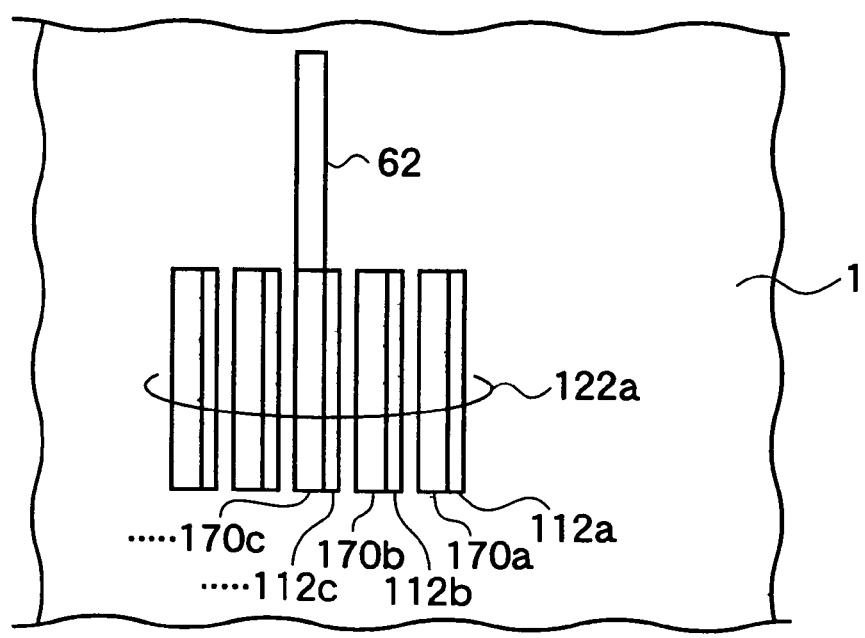

Also, as shown in FIG. 13, it is possible to measure the relative displacement between the diffraction pattern, which is the transferred image of the first asymmetrical diffraction grating 122a and the reference projected image, which is the transferred image of the isolated opaque pattern 62, in a configuration such that the patterns of the first asymmetrical diffraction grating 122a and the isolated opaque pattern 62 are arranged adjacently in parallel, in which the longitudinal directions of each of the striped patterns are the same, while the transverse directions of the striped patterns lie on two different parallel lines, respectively.

Nest, a method for manufacturing the photomask encompassing, on the same mask substrate 1, the asymmetrical diffraction grating (first asymmetrical diffraction grating) 22a, which generates the positive first order, diffracted light and the negative first order diffracted light in different diffraction efficiencies shown in FIG. 5, and the device pattern 15 shown in FIG. 6 will be explained, referring to FIGS. 14A to 22B.

Figure 14A:
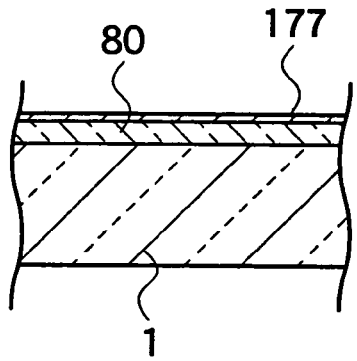
FIG. 14A to FIG. 22B are cross sectional views showing corresponding process steps respectively, in a sequence of the photomask manufacturing method in accordance with the first embodiment of the present invention.
Figure 14B:
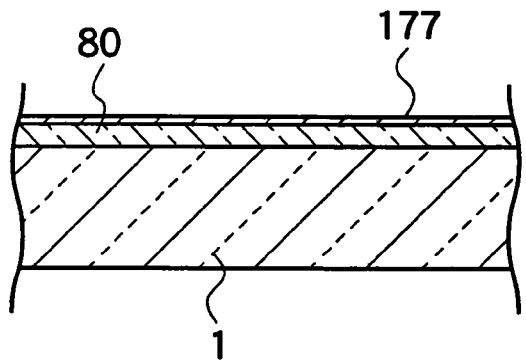

(a) As shown in FIGS. 14A and 14B, a mask substrate 1 formed of a substance such as fused silica glass is prepared. Next, a semi-transparent film 80 formed of a substance such as MoSi is disposed on the mask substrate 1 to the level of the thickness where the transmitted light has a phase of 180 degrees, using a process such as a sputtering method. Further an opaque film 177 formed of a substance such as chromium (Cr) is coated on the semi-transparent film 80, using such a method as vacuum evaporation. FIG. 14A shows a laminated structure implemented by the opaque film 177 and the semi-transparent film 80 stacked on the opaque film 177 in an area where the device patterns are scheduled to be formed, while FIG. 14B shows a laminated structure implemented by the opaque film 177 and the semi-transparent film 80 stacked on the opaque film 177 in an area where the monitoring patterns are scheduled to be formed.

Figure 15A:
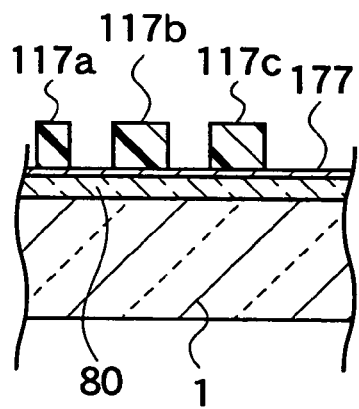
Figure 15B:
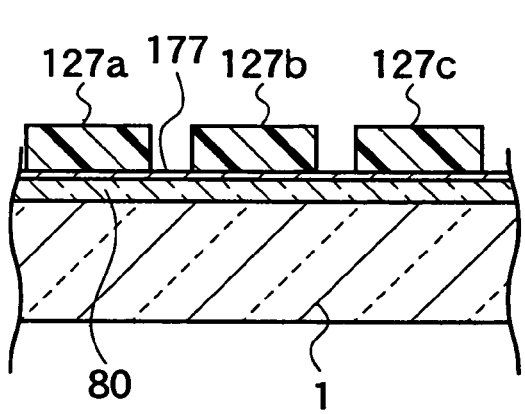

(b) Next, a resist film is spin coated on the opaque film 177. And as shown in FIG. 15A, the first resist masks 117a, 117b, 117c are delineated on the opaque film 177 in the device-pattern-scheduled area, and simultaneously as shown in FIG. 15B, the first resist masks 127a, 127b, 127c are delineated on the opaque film 177 in the monitoring-pattern-scheduled area respectively using the photolithography process.

Figure 16A:
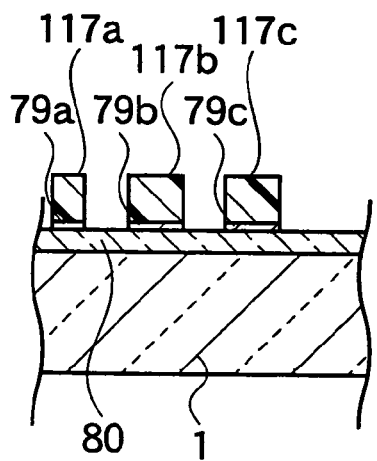
Figure 16B:
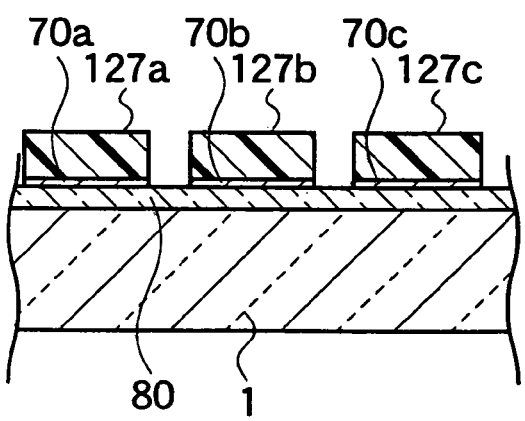

(c) Using the first resist masks 117a, 117b, 117c, 127a, 127b, 127c as a mask, part of the opaque film 177 is selectively etched away with the anisotropic etching until the semi-transparent film 80 is exposed. And as shown in FIG. 16A a plurality of opaque strips 79a, 79b, 79c are delineated in the device-pattern-scheduled area, and simultaneously as shown in FIG. 16B a plurality of opaque strips (first opaque strips) 70a, 70b, 70c are delineated in the monitoring-pattern-scheduled area, respectively.

Figure 17A:
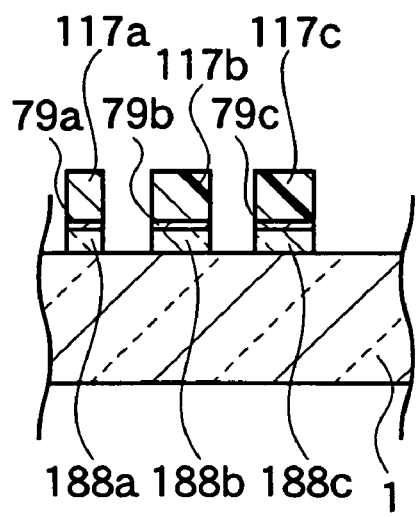
Figure 17B:
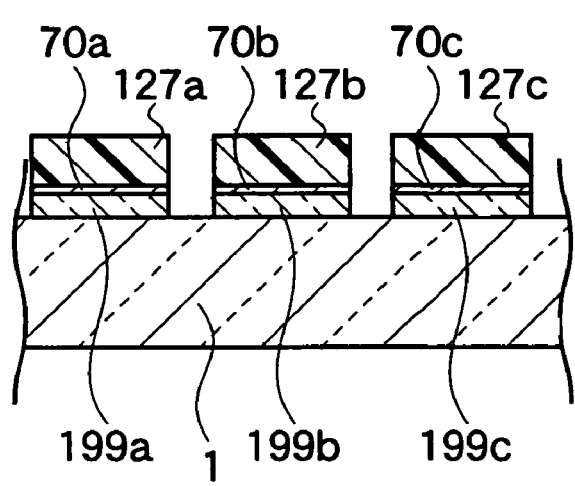

(d) Using the first resist masks 117a, 117b, 117c, 127a, 127b, 127c as a mask, part of the semi-transparent film 80 is selectively etched away with the anisotropic etching until the mask substrate 1 is exposed. And as shown in FIG. 17A the first phase shifting films 188a, 188b, 188c are delineated in the device-pattern-scheduled area, and simultaneously as shown in FIG. 17B, the second phase shifting films 199a, 199b, 199c are delineated in the monitoring-pattern-scheduled area, respectively. The second phase shifting films 199a, 199b, 199c are implemented by a plurality striped patterns of the semi-transparent films, which are repetitively and periodically arranged.

Figure 18A:
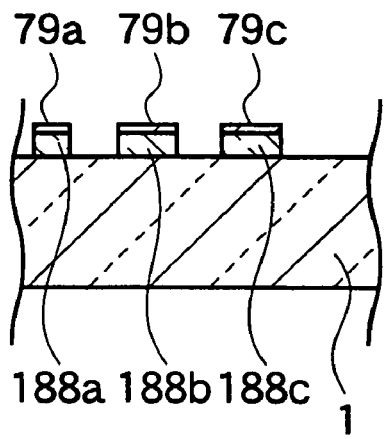
Figure 18B:
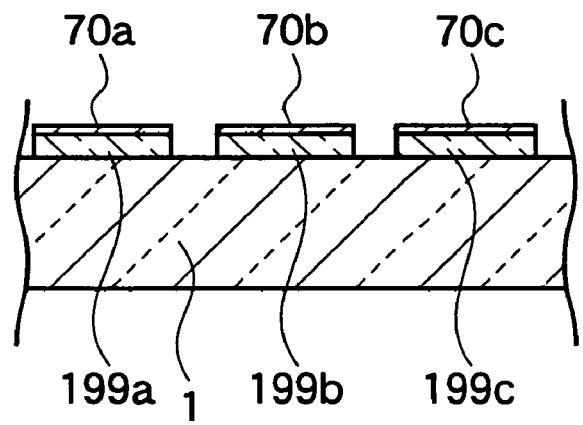
Figure 19A:
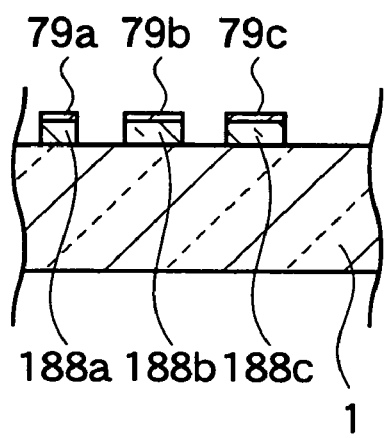
Figure 19B:
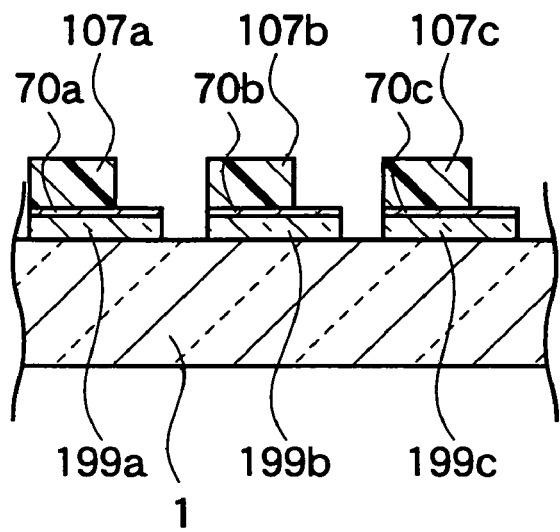

(e) As shown in FIGS. 18A and 18B, the first resist masks 117a, 117b, 117c, 127a, 127b, 127c are removed with a resist removal agent. Afterward, the mask substrate 1 is spin coated with a resist film, and the second resist masks 107a, 107b, 107c are delineated on the part of the opaque strips 70aa, 70b, 70c in the monitoring-pattern-scheduled area respectively, using the lithography process as shown in FIG. 19B. On the other hand, as shown in FIG. 19A, in the device-pattern-scheduled area, the mask substrate 1 is not coated with the resist film.

Figure 20A:
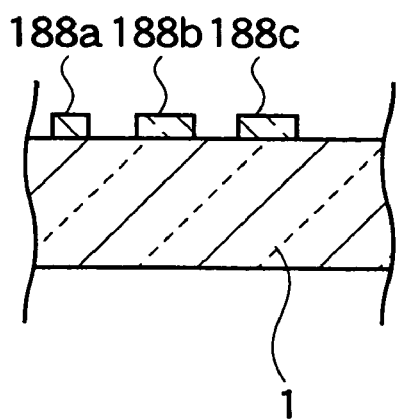
Figure 20B:
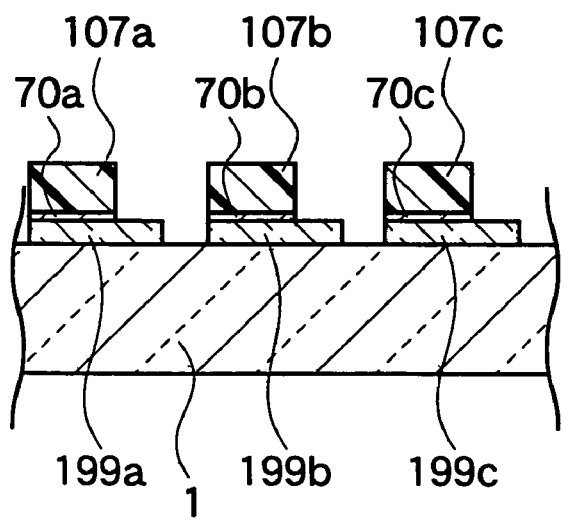

(f) As shown in FIG. 20A, the opaque strips 79a to 79c are selectively etched away respectively with the anisotropic etching until the first phase shifting films 188a, 188b, 188c are exposed in the device-pattern-scheduled area. Simultaneously, using the second resist masks 107a, 107b, 107c as a mask, the opaque strips 70aa to 70c are delineated, by selectively etching the opaque strips 70aa, 70b, 70c using the anisotropic etching, until the second phase shifting films 199a, 199b, 199c are exposed in the monitoring-pattern-scheduled area. The opaque strips 70aa to 70c are shifted one-sidedly on the opaque strips 70aa, 70b, 70c so as to implement asymmetrical topology.

Figure 21A:
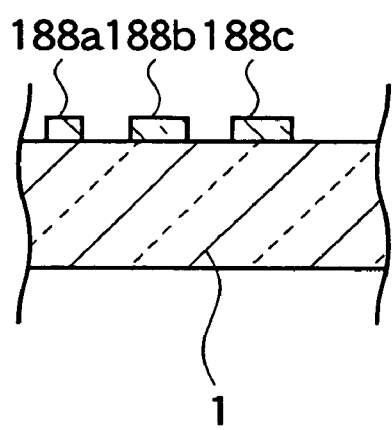
Figure 21B:
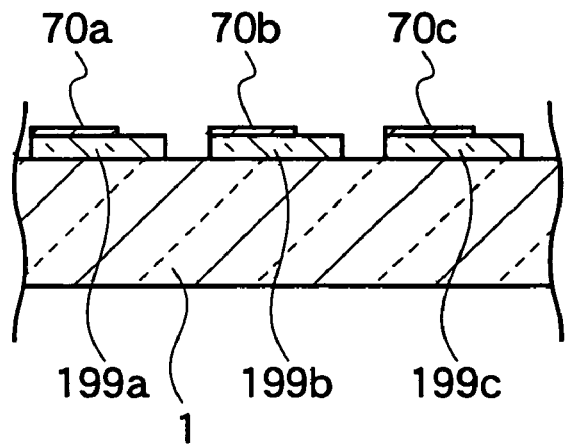
Figure 22A:
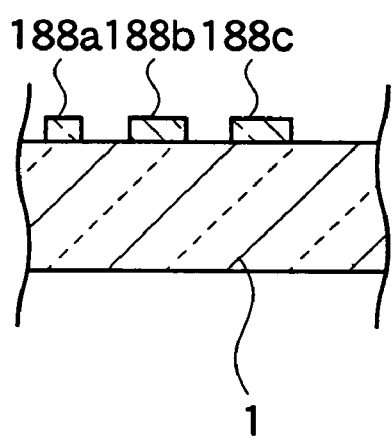
Figure 22B:
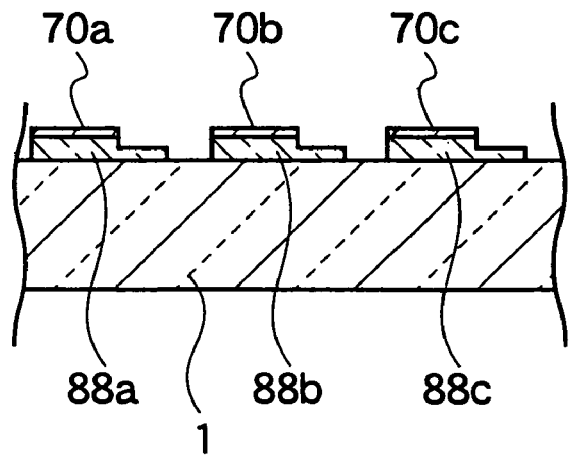

(g) The second resist masks 107a to 107c are removed with a resist removal agent respectively. Then, as shown in FIG. 21A, the opaque films are completely removed from the top surfaces of the first phase shifting films 188a, 188b, 188c in the device-pattern-scheduled area, while as shown in FIG. 21B, a one-dimensional grid pattern implemented by the repetitive periodic opaque strips 70aa, 70b, 70c, which are remaining on the top surfaces of the second phase shifting films 199a, 199b, 199c is delineated in the monitoring-pattern-scheduled area. Afterward, exposed portion of the second phase shifting films 199a to 199c are selectively etched away to a specific depth, or a specific thickness measured from the top surface of the mask substrate 1, which can establish the phase difference of 90 degrees in the transmitted light through the second phase shifting films 199a to 199c, using gallium (Ga) focused ion beam, etc. Simultaneously, the top surfaces of the first phase shifting films 188a, 188b, 188c are also etched away to the specific thickness where the phase difference of the transmitted light through the first phase shifting films 188a, 188b, 188c reaches 90 degrees. And as shown in FIG. 22A a device pattern implemented by the first phase shifting films 188a, 188b, 188c are delineated in the device-pattern-scheduled area. And the first probing-phase shifters 88a to 88c are formed so as to implement the monitoring pattern as shown in FIG. 22B in the monitoring-pattern-scheduled area, thus completing the photomask according to the first embodiment of the present invention. An asymmetrically recessed ridge, which has an one-sidedly displaced recess at one of upper corners, establishes each of the first probing-phase shifters 88a to 88c. The first probing-phase shifters 88a to 88c are implemented by stripes of the semi-transparent film. Because, as shown in FIG. 22B, each of the first probing-phase shifters 88a to 88c has an asymmetric geometry with a displaced recess, or a recess displaced rightward from the geometric center, the first probing-phase shifters 88a to 88c can implement the asymmetrical diffraction grating 22a which generates the positive first order diffracted light and the negative first order diffracted light in different diffraction efficiencies.

According to the manufacturing process as explained above, it is possible to manufacture the photomask, which includes both of the device pattern, encompassing the first phase shifting films 188a to 188c, disposed on the mask substrate 1, and the monitoring pattern, which implements the asymmetrical diffraction grating encompassing the first probing-phase shifters 88a to 88c, disposed on the same mask substrate 1, and the opaque strips 70aa to 70c are disposed on the top surfaces of the first probing-phase shifters 88a to 88c. In earlier technology, it has been difficult to provide the monitoring pattern, which implements a diffracting grating having a phase shifter on the same substrate on which the device pattern is formed. Therefore it is necessary to prepare two masks, one for the testing photomask, which includes an asymmetrical diffraction grating, and one for the production reticle, which includes a device pattern. According to the manufacturing method put forth above, however, it is possible to provide working phase shifters (first phase shifters) 188a to 188c, as shown in FIG. 22A, and the probing-phase shifters (second phase shifters) 88a to 88c, as shown in FIG. 22B, respectively with a high level of precision on the same mask substrate 1. Both of the device pattern and the monitoring pattern, which implements the asymmetrical diffraction grating, each of the device pattern and the monitoring pattern having phase shifter for the transmitted light, can be formed on the mask substrate 1, through a sequence of the processes where the first phase shifting films 188a to 188c and the second phase shifting films 199a to 199c are -formed respectively at the same process on the mask substrate 1 as shown in FIGS. 18A and 18B and after the process, each of the top surface of the second phase shifting films 199a to 199c is selectively etched away so as to form a recess.

Second Embodiment

A reduction projection lithography tool 321 concerned of the second embodiment of the present invention, adding to the structural members of the reduction projection lithography tool shown in FIG. 1, encompasses a first probing optical system (65a, 68a, 67a, 66a). The first probing optical system (65a, 68a, 67a, 66a) includes a probing laser oscillator 65a, a reflection mirror 68a, a beam splitter 67a and a TTL sensor 66a. The reflection mirror 68a guides the laser light emitted by the probing laser oscillator 65a to the monitoring pattern 20a and the alignment mark 26a of the photomask 5. The beam splitter 67a is disposed below the photomask 5. The TTL sensor 66a receives the laser light split by the beam splitter 67a.

Figure 23:
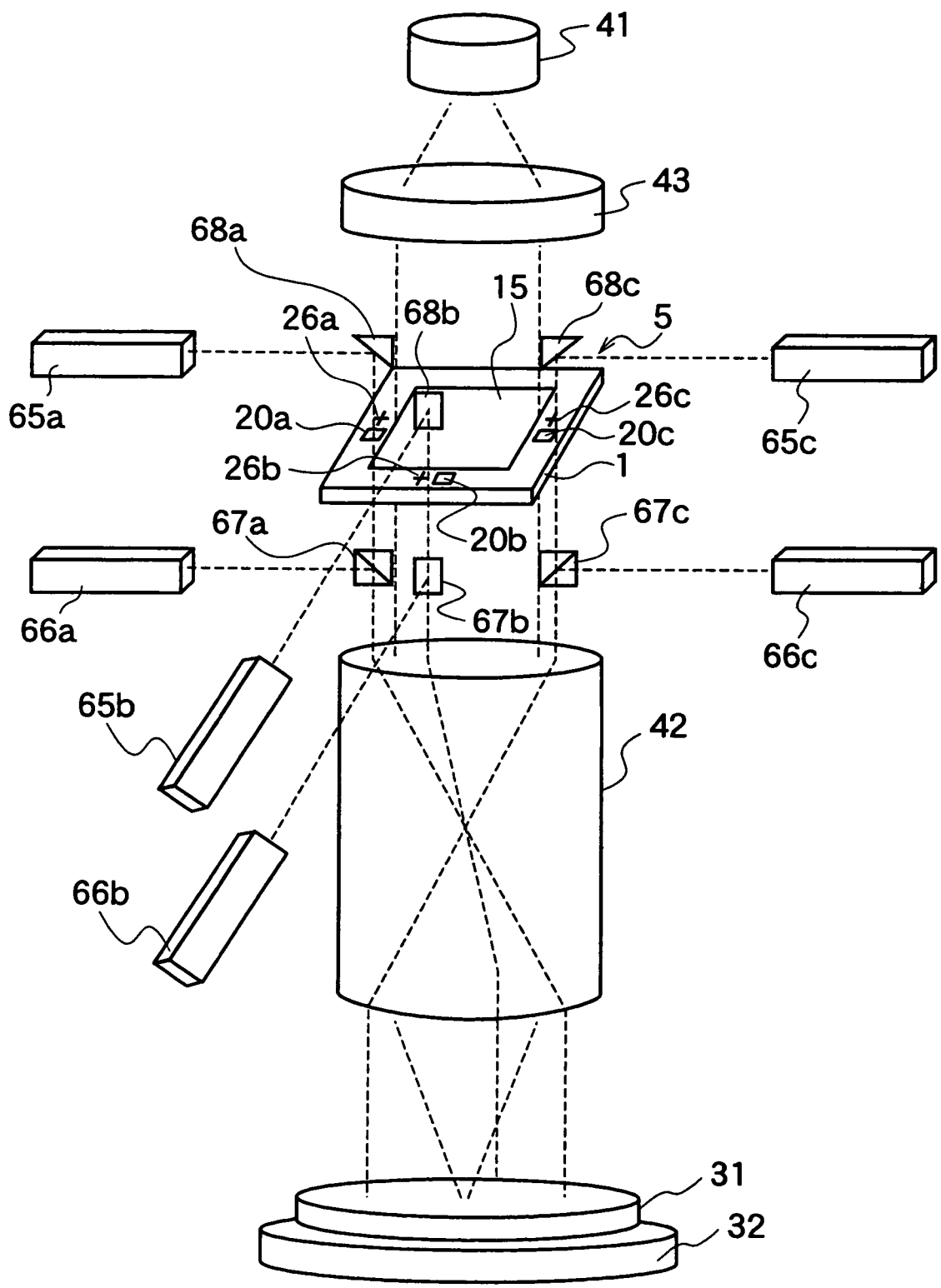
FIG. 23 is a perspective view showing a projection lithography tool in accordance with the second embodiment of the present invention.

In FIG. 23, the laser light emitted from the probing laser oscillator 65a has a wavelength that is outside of the sensitivity range of the resist coated on the wafer 31, and the laser light is guided by the reflection mirror 68a to the monitoring pattern 20a and the alignment mark 26a of the photomask 5. The laser light transmitted through the monitoring pattern 20a and the alignment mark 26a passes through the beam splitter 67a and the projection optical system 42 and is irradiated upon the surface of the wafer 31. The projected images of the monitoring pattern 20a and the alignment mark 26a on the surface of the wafer 31 pass through the projection optical system 42 and the beam splitter 67a and are sensed by the TTL sensor 66a.

Likewise, the reduction projection lithography tool 321 concerned of the second embodiment of the present invention encompasses the second probing optical system (65b, 68b, 67b, 66b) for both of the monitoring pattern 20b and the alignment mark 20b. The second probing optical system (65b, 68b, 67b, 66b) includes a probing laser oscillator 65b, a reflection mirror 68b, a beam splitter 67b and a TTL sensor 66b.

Further, the reduction projection lithography tool 321 concerned of the second embodiment of the present invention encompasses the third probing optical system (65c, 68c, 67c, 66c) for both of the monitoring pattern 20c and the alignment mark 20c. The second probing optical system (65c, 68c, 67c, 66c) includes a probing laser oscillator 65c, a reflection mirror 68c, a beam splitter 67c and a TTL sensor 66c as well. And other structural features of the reduction projection lithography tool 321 are similar to those of the reduction projection lithography tool shown in FIG. 1, the description thereof is omitted.

When the photomask and the first to the third probing optical system are used in this manner, it becomes possible to observe each of the projected images of the monitoring patterns 20a, 20b and 20c, while the wafer 31 is installed in the reduction projection lithography tool 321. This is because it is unnecessary to develop the wafer 31 after exposure so as to carry out observation of the monitoring patterns 20a, 20b and 20c. Therefore, using the computer system connected to projection lithography tool for adjusting an optical system of the projection lithography tool shown in FIG. 9 and the exposure method shown in FIG. 10, it becomes possible to project the image of the device pattern 15 with the optical system 140 which is well adjusted with a high level of precision, without exchanging the wafer 31 shown in FIG. 23. Also, because the alignment marks 26a, 26b, 26c are arranged respectively adjacent to one of the monitoring patterns 20a, 20b, 20c, it is possible to simultaneously align the positioning of the wafer 31 along the horizontal plane of the wafer 31.

Third Embodiment

Figure 24:
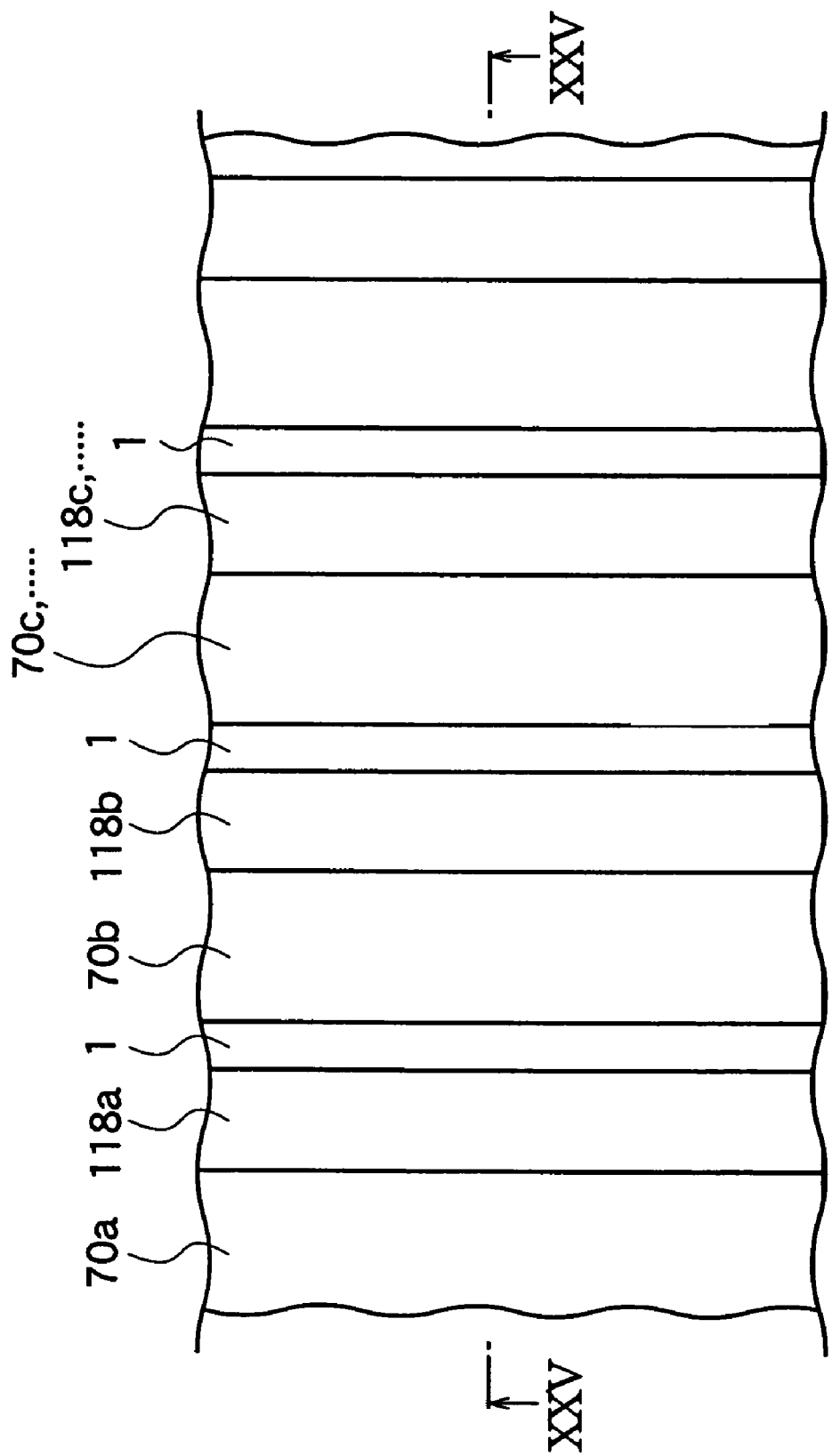
FIG. 24 is a plan view showing an asymmetrical diffracting grating in accordance with the third embodiment of the present invention.
Figure 25:
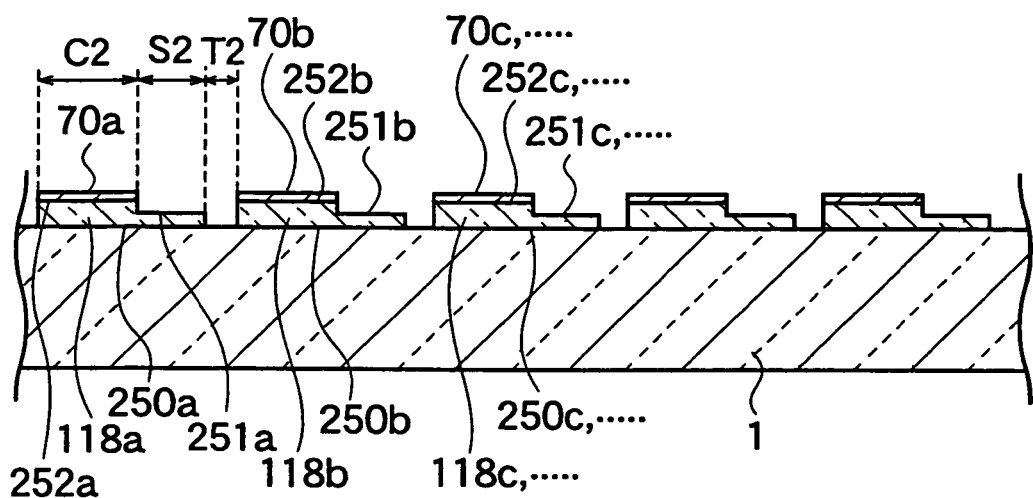
FIG. 25 is a cross sectional view showing the asymmetrical diffracting gratings in accordance with the third embodiment of the present invention.

FIG. 24 is a plan view showing an asymmetrical diffracting grating 22a, corresponding to cross sectional view shown in FIG. 5, in accordance with the third embodiment of the present invention. FIG. 25 is a cross sectional view showing the asymmetrical diffracting grating (first asymmetrical diffracting grating) 22a taken on line XXV-XXV in FIG. 24.

As shown in FIG. 25, the asymmetrical diffraction grating 22a in accordance with the third embodiment of the present invention, as like in FIG. 5, is implemented by a plurality of asymmetrically recessed ridges, each of which has an asymmetric topology, and the asymmetrically recessed ridges are disposed periodically on the mask substrate 1. And as shown in FIG. 24, each of the asymmetrically recessed ridges runs in parallel so as to form a striped geometry in a plan view. Each of the asymmetrically recessed ridge is formed of semi-transparent material.

In FIG. 25, the first asymmetrically recessed ridge from the left end has an exit face 251a implemented by a top surface of the lower step and a light-shielding face 252a implemented by a top surface of the upper step, which has a higher horizontal level than the lower step so as to form a displaced recess, or a recess displaced rightward from the geometric center, establishing the asymmetrical topology in a cross sectional view. Similarly, the second asymmetrically recessed ridge from the left end has an exit face 251b implemented by a top surface of the lower step and a light-shielding face 252b implemented by a top surface of the upper step, which has a higher horizontal level than the lower step so as to form the asymmetrical topology. The third asymmetrically recessed ridge from the left end has an exit face 251c implemented by a top surface of the upper step, which has a higher horizontal level than the lower step so as to form a displaced recess establishing the asymmetrical topology. And the fourth, fifth asymmetrically recessed ridges, etc. have the similar the asymmetric configurations, each having the lower and upper steps. The bottom surfaces of the first, second and third asymmetrically recessed ridges, . . . from the left end implement entrance faces 250a, 250b, 250c, . . . contacting with the top surface of the mask substrate 1. These asymmetrically recessed ridges established by two steps, which are formed of the semi-transparent material implement probing-phase shifters 118a, 118b, 118c, . . . , respectively. And a plurality of first opaque strips 70a, 70b, 70c, . . . formed of Cr films are one-sidedly disposed on the light-shielding faces 252a, 252b, 252c, . . . of the probing-phase shifters 118a, 118b, 118c, . . . respectively.

It is preferable to prescribe the geometrical dimensions of each lattice of the first asymmetrical diffracting grating 22a with a relationship:

$$C2:S2:T2=3:2:1 \quad (2)$$

Where C2 is a width of the first opaque strips 70a, 70b, 70c, . . . , S2 is a width of each of the exit faces 251a, 251b, 251c, . . . and T2 is the interval between each of the probing-phase shifters 118a, 118b, 118c, . . . , which are disposed on the mask 1 substrate 1. The asymmetrical diffracting grating 22a shown in FIGS. 24 and 25 in accordance with the third embodiment of the present invention differs from the features established by the first asymmetrical diffracting grating 22a shown in FIG. 5 in that, using R as an attenuation constant of the light, which is incident upon each of the entrance faces 250a, 250b, 250c, . . . , propagating through the probing-phase shifters 118a, 118b, 118c, . . . , so as to leave from the exit faces 251a, 251b, 251c, . . . , the width S2 is 1/R times of the interval T For instance, in a case where each of the probing-phase shifters 118a, 118b, 118c, . . . is formed of such a material as molybdenumsilicide (MoSi), and each of the exit faces 251a, 251b, 251c, . . . is established so that the transmitted light through the exit faces 251a, 251b, 251c, . . . has a 90-degree-phase difference against the light which doesn't transmit through the each of the probing-phase shifters 118a, 118b, 118c, . . . , the amplitude of the transmitted light from each of the exit faces 251a, 251b, 251c, . . . attenuates to about ½.

For instance, following geometrical dimensions can be employed using Eq. (2):

C2=0.21 μm;

S2=0.14 μm;

T2=0.07 μm

Since as to the discussion relating to materials implementing the probing-phase shifters 118a, 118b, 118c, . . . shown in FIGS. 24 and 25 are similar to the features explained in the first embodiment, referring to FIG. 5, the overlapping or redundant description is omitted in the third embodiment. Furthermore, each of the configurations of the second, third and fourth asymmetrical diffraction gratings 22c, 22b and 22d shown in FIG. 3 is similar to the first asymmetrical diffraction 22a shown in FIG. 25, the overlapping or redundant description is omitted.

Figure 26:
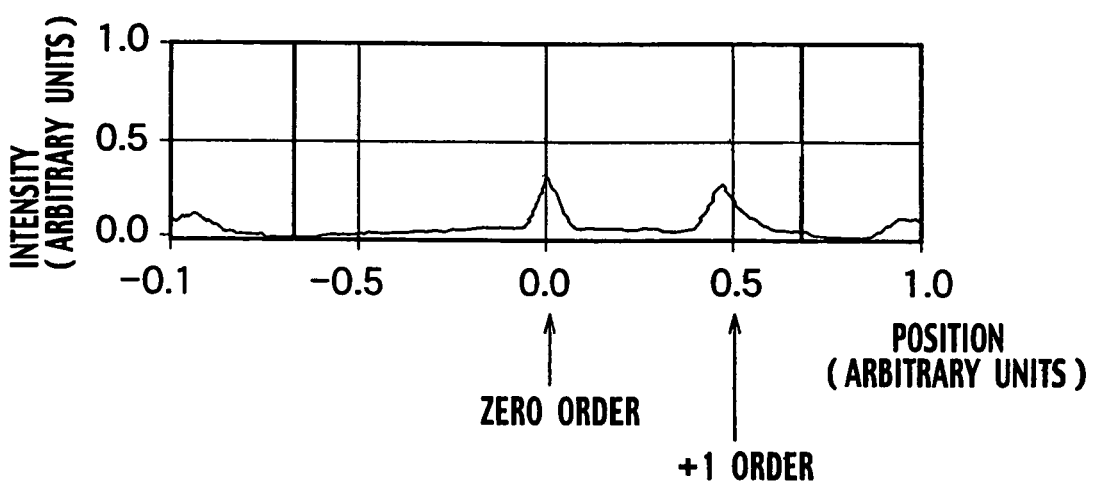
FIG. 26 is a diagram showing a distribution of the light intensity on a surface of pupil in accordance with the third embodiment of the present invent.

Here, FIG. 26 shows the result of calculation of the distribution of light intensity on the surface of the pupil in the case where an argon fluoride (ArF) excimer laser light shines the first asymmetrical diffracting grating 22a shown in FIGS. 24 and 25, from the upper position of the photomask, in a configuration in which the surface on which the probing-phase shifters 118a, 118b, 118c, . . . are formed faces downward direction. In FIG. 26, abscissa represents the position within the surface of the pupil, while ordinate represents the light intensity. As shown in FIG. 26, the first order diffracted light is generated on only the positive side and is not generated on the negative side, in relation to the intensity of the zero order diffracted light on the pupil location.

Although, in FIG. 25, S2:T2 is taken to be 2:1, as long as S2 is taken over twice times as T2, the similar effectiveness can be obtained, establishing the asymmetrical diffraction.

If the photomask 5 on which the first asymmetrical diffracting grating 22a is delineated as shown in FIGS. 24 and 25 so as to implement an asymmetric diffraction such that the first order diffraction is established only either the positive or negative side is disposed installed in the reduction projection lithography tool, and when the wafer stage 32 is shifted 100 nm in the direction along the optical axis, the projected image of the first asymmetrical diffracting grating 22a on the wafer 31 will shift 25 nm perpendicularly to the optical axis so as to establish the linear proportional relation with the shifted length of the wafer stage 32.

The above phenomenon can be demonstrated in theory as well. For instance, in a case where a coherent light with a wavelength of λ is incident from the perpendicular direction to an asymmetrical diffraction grating having a grating period P, which is configured to generate the diffracted light either on the positive or negative side, when the diffraction grating is exposed with a coherent light with a wavelength of λ from the perpendicular direction, using the horizontal plane x-y where the wafer is disposed, and using the optical axis direction z which is perpendicular to the plane x-y, the amplitude E(x,z) of the light projected on the wafer can be expressed by the following Eq. (3).

$$E(x,z)=c_0+c_1\exp[2\pi i(x/P+kz-W_1)] \quad (3)$$

Here, $W_1$ is phase error of the diffracted light ascribable to aberration, and $c_i$ is Fourier intensity of the i-th order diffraction.

$$k=(1-[1-(\lambda/P)^2]^{1/2})/\lambda \quad (4)$$

The light intensity I(x, z) of the image projected on the wafer is expressed as the second power of the absolute value of the afore mentioned E(x, z), and the following equation is given:

$$I(x,z)=|E(x,z)|^2=c_0^2+c_1^2+2c_0c_1\cos[2\pi(x/P+kz-W_1)] \quad (5)$$

Here, in order to obtain bright lines (bright fringes), in the Eq. (5)

$$\cos[2\pi(x/P+kz-W_1)]=1 \quad (6)$$

therefore, $$x/P+kz-W_1=0 \quad (7)$$

By differentiating Eq. (7) with respect to z, the Eq. (8) is attained.

$$dx/dz=-kP \quad (8)$$

Eq. (8) represents that the amount of the horizontal displacement dx of the projected image on the wafer, by the asymmetrical diffraction grating configured to generate the diffracted light along either the positive or negative direction, and the amount of the vertical variation dz of the position of the wafer along the optical axis direction have a proportional relation.

Again, in a case where the photomask 5, on which the monitoring pattern 20a shown in FIG. 3 is delineated, is installed in the reduction projection lithography tool shown in FIG. 1, the difference in the horizontal displacements dx of the focal points of the projected images between the first asymmetrical diffracting grating 22a and the perpendicularly-adjacent third asymmetrical diffraction grating 22b represents the astigmatism of the optical system 140 of the reduction projection lithography tool shown in FIG. 1. Here, as shown in FIG. 3, the progress direction of the repetitive periodic pattern of the first asymmetrical diffraction grating 122a and the progress direction of the repetitive periodic pattern of the second asymmetrical diffraction grating 122b implement a mutually orthogonal coordinate. Therefore, if approximate functions of the linear relationships between the horizontal displacements dz of the projected image of the respective asymmetrical diffraction gratings 22a and 22b, and the vertical variations dx along the optical axis of the wafers are calculated, the astigmatic aberration can be obtained from the differences in the intercepts of respective approximate functions. The same discussion also applies to the perpendicularly adjacent second and third asymmetrical diffracting gratings 22b and 22c, the perpendicularly adjacent second and fourth asymmetrical diffracting gratings 22c and 22d, and the perpendicularly adjacent fourth and first asymmetrical diffracting gratings 22d and 22a, which implement the mutually orthogonal coordinate, respectively.

Figure 27:
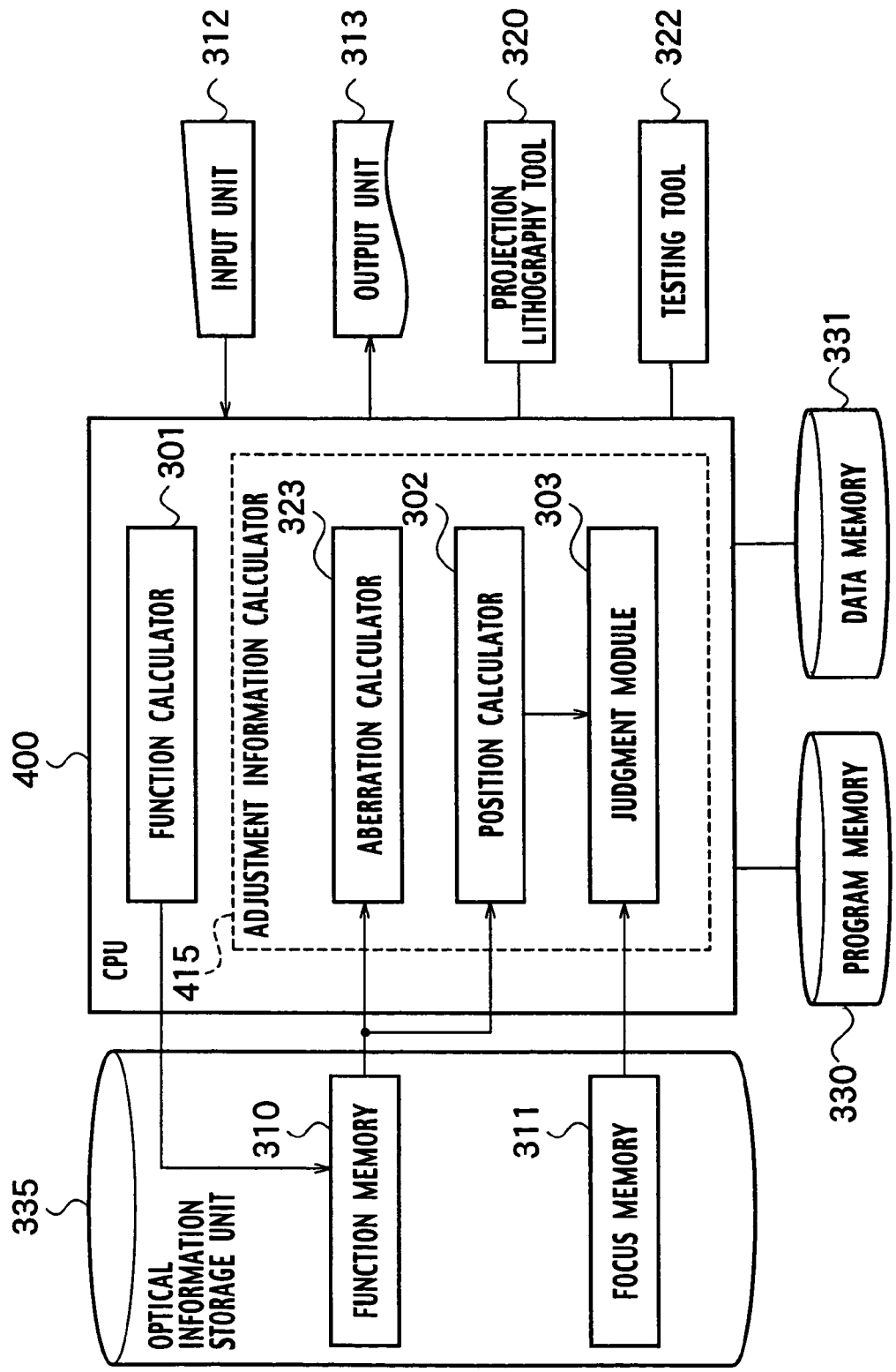
FIG. 27 is a block diagram showing a computer system connected to the projection lithography tool for adjusting an optical system of the projection lithography tool in accordance with the third embodiment of the present invention.

A computer system connected to the projection lithography tool for adjusting an optical system of the projection lithography tool according to the third embodiment of the present invention as shown in FIG. 27, differs from the features explained in FIG. 9 in the configuration of a central processing unit (CPU) 400. Namely the CPU 400 of the computer system shown in FIG. 27 encompasses an adjustment information calculator 415, which additionally embraces an aberration calculator 323 compared with the organization of the adjustment information calculator 315.

The other features of the computer system shown in FIG. 27 are similar to the configuration shown in FIG. 9, and overlapping or redundant description is omitted. Here, the aberration calculator 323 calculates whether the aberration is occurring in the optical system of the reduction projection lithography tool shown in FIG. 1 through a sequence of procedures, which compares a plurality of approximate functions stored in the function memory 310.

Next, an explanation will be made with respect to the photomask 5, on which the asymmetrical diffraction grating is delineated as shown in FIGS. 24 and 25, and an exposure method using the computer system connected to the projection lithography tool for adjusting an optical system of the projection lithography tool, with reference to FIGS. 1, 27 and 28.

Figure 28:
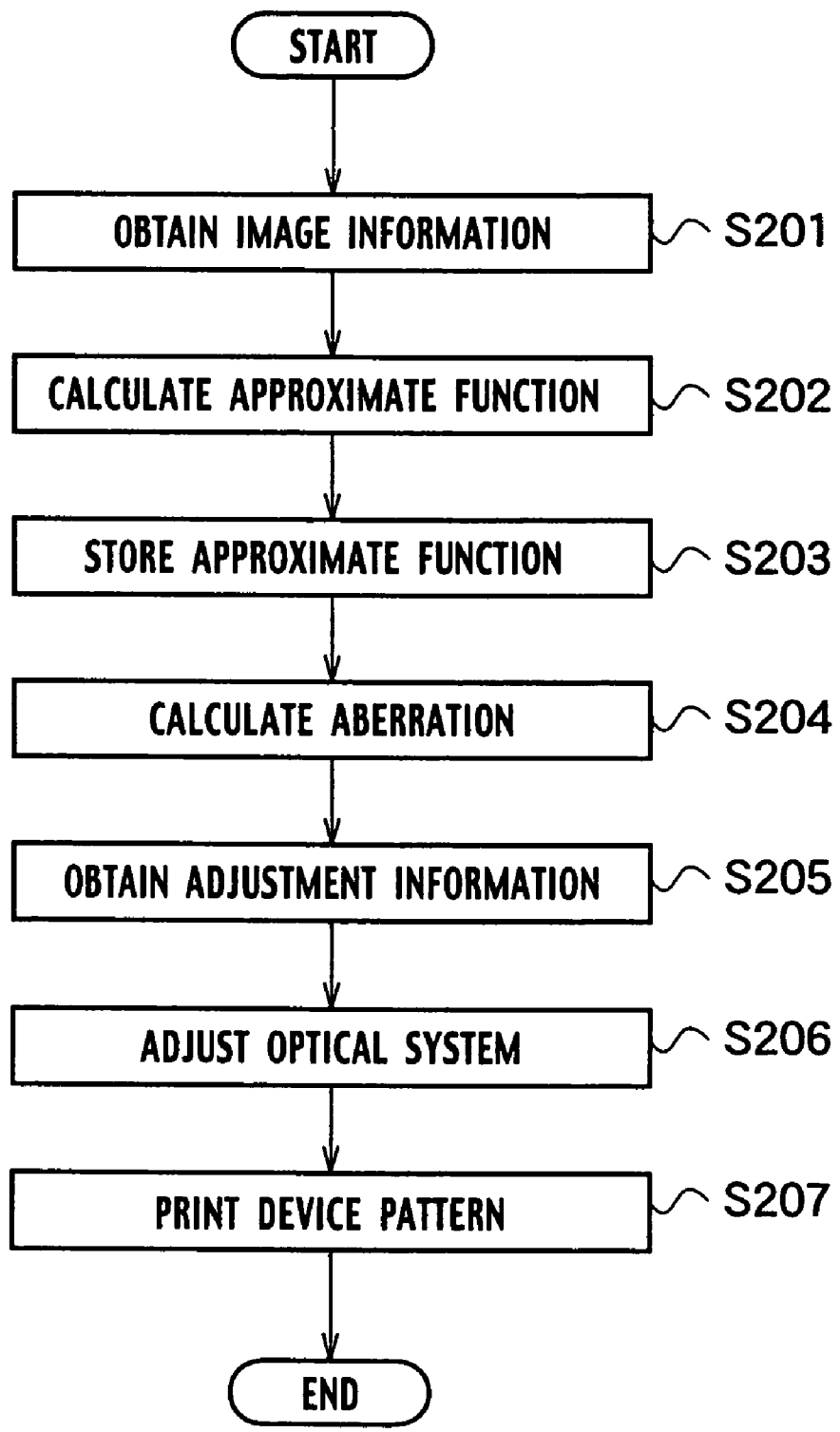
FIG. 28 is a flowchart showing a lithography method in accordance with the third embodiment of the present invention.

(a) The sequence of procedures from step S201 to step S203 through the process of step S202 in the flow chart shown in FIG. 28, is similar to the sequence of procedures from the step S111 to the step S113 in the flow chart shown in FIG. 10. Therefore, in the same manner explained in the first embodiment, corresponding approximate functions are memorized in the function memory 310 shown in FIG. 27.

(b) At step S204, the aberration calculator 323 calculates whether the aberration is occurring in the optical system 140 of the reduction projection lithography tool, after reading out and comparing a plurality of approximate functions stored in the function memory 310.

(c) At step S205, the aberration calculated at step S204', is delivered to the output unit 313 shown in FIG. 27.

(d) At step S206, the optical system 140 shown in FIG. 1 is adjusted, according to the aberration calculated at step S205.

(e) At step S207, the image of the device pattern 15 delineated on the photomask 5 is printed on the wafer 31 shown in FIG. 1. Thus completes the exposure procedures in the manufacturing process of the semi-conductor device.

As mentioned above, using the photomask 5 shown in FIG. 2, by the computer system connected to the projection lithography tool for adjusting an optical system of the projection lithography tool shown in FIG. 27 and by the exposure method shown in FIG. 28, it becomes possible to achieve a projection of the image of the device pattern 15, using the optical system 140, the aberration of which is precisely adjusted, in the reduction projection lithography tool shown in FIG. 1.

Other Embodiment

Various modifications will become possible for those skilled in the art after receiving the teaching of the present disclosure without departing from the scope thereof.

Although, in the above-mentioned embodiments, the photomask 5, as shown in FIG. 2, was assumed to encompass both of the asymmetrical-diffraction-grating sets 222 to 222c and the device patterns 15a to 15c, for instance, it is possible to provide only the testing photomask, on which the monitoring pattern 20a as shown in FIG. 3 is delineated, for adjusting an optical system of the projection lithography tool in the manufacturing process of semiconductor device, in such a way that the optical system of the projection lithography tool is adjusted for the existent device patterns, using the adjustment data obtained by the testing photomask.

Thus, the present invention of course includes various embodiments and modifications and the like which are not detailed above. Therefore, the scope of the present invention will be defined in the following claims.

What is claimed is:

1. A method for projecting an image of a photomask on a wafer, comprising:

installing a photomask having a device pattern and an asymmetrical diffraction grating implemented by probing-phase shifters into a projection lithography tool, the asymmetrical diffraction grating being configured to generate a positive first order diffracted light and a negative first order diffracted light in different diffraction efficiencies, the asymmetrical diffraction grating including a plurality of probing-phase shifters formed of semi-transparent material, disposed periodically on the mask substrate in parallel, each of the probing-phase shifters being implemented by an asymmetrically recessed ridge, a geometry of the asymmetrically recessed ridge being defined by:

a strip-shaped entrance face contacting with the mask substrate, extending along the longitudinal direction of the asymmetrically recessed ridge, a strip-shaped exit face opposite to the entrance face implemented by a top surface of a lower step of the asymmetrically recessed ridge, the lower step being displaced on one side of the asymmetrically recessed ridge in plan view, extending along the longitudinal direction, and a strip-shaped light-shielding face implemented by a top surface of an upper step of the asymmetrically recessed ridge, the upper step having a higher horizontal level than the lower step, the upper step being adjacent to the lower step and displaced on another side of the asymmetrically recessed ridge in plan view, extending along the longitudinal direction;

obtaining image information of projected images of the asymmetrical diffraction gratings on monitoring wafers, by varying the positions of the monitoring wafers along an optical axis of an optical system of the projection lithography tool;

calculating an approximate function prescribing a relationship between the positions of the monitoring wafers along the optical axis and the image information;

calculating a most suitable focal position for a working wafer;

adjusting a position of the working wafer to the most suitable focal position in the optical system; and projecting the device pattern on the working wafer, while keeping the adjusted position of the working wafer, wherein a phase difference between light transmitting through the probing-phase shifters and light not transmitting through the probing-phase shifters is integer multiples of a value larger than zero and lower than 180 degrees, and a width of the exit face measured perpendicular to the longitudinal direction is 1/R times an interval between the probing-phase shifters, where R is an attenuation constant of light leaving from the exit face, after the light propagates through each of the probing-phase shifters.

2. The method of claim 1, wherein the approximate function prescribes a relationship between a variation of the positions of the monitoring wafers along the optical axis and the relative displacements of projected images of the asymmetrical diffraction grating on the monitoring wafers, the displacements moving perpendicular to the optical axis.

3. The method of claim 2, further comprising:

calculating defocus of the position of the working wafer from the most suitable focal position by the approximate function, before adjusting the position of the working wafer.

4. The method of claim 2, further comprising:

calculating whether an aberration is occurring in the optical system, comparing a plurality of approximate functions, before adjusting the position of the working wafer.

* * * * *